US012395188B2

(12) United States Patent
Akkem

(10) Patent No.: US 12,395,188 B2
(45) Date of Patent: Aug. 19, 2025

(54) APPARATUS AND METHOD FOR PROCESSING RECEIVE DATA IN A RECEIVE DATA PATH INCLUDING PARALLEL FEC DECODING

(71) Applicant: Microchip Technology Incorporated, Chandler, AZ (US)

(72) Inventor: Sailaja Akkem, Austin, TX (US)

(73) Assignee: Microchip Technology Incorporated, Chandler, AZ (US)

( * ) Notice: Subject to any disclaimer, the term of this patent is extended or adjusted under 35 U.S.C. 154(b) by 28 days.

(21) Appl. No.: 18/481,359

(22) Filed: Oct. 5, 2023

(65) Prior Publication Data

US 2024/0120944 A1    Apr. 11, 2024

Related U.S. Application Data

(60) Provisional application No. 63/378,690, filed on Oct. 7, 2022.

(51) Int. Cl.
*H03M 13/11* (2006.01)
*H03M 13/00* (2006.01)

(52) U.S. Cl.
CPC ... *H03M 13/1137* (2013.01); *H03M 13/6561* (2013.01)

(58) Field of Classification Search
None
See application file for complete search history.

(56) References Cited

U.S. PATENT DOCUMENTS 6,795,451 B1 * 9/2004 Giorgetta ............. H04L 1/0083
                                                         370/428
7,035,292 B1 * 4/2006 Giorgetta ............. H04J 3/1611
                                                         370/510
8,788,917 B2   7/2014 Bliss
8,959,418 B1 * 2/2015 Pfister ............. H03M 13/2948
                                                         714/746

(Continued)

FOREIGN PATENT DOCUMENTS

WO    00/57561 A1    9/2000

OTHER PUBLICATIONS

International Search Report of International Application No. PCT/US2023/076137, mailed Jan. 31, 2024, 5 pages.

(Continued)

*Primary Examiner* — Daniel F. McMahon
(74) *Attorney, Agent, or Firm* — TraskBritt

(57) ABSTRACT

An apparatus comprises a data width converter and a forward error correction (FEC) decoder. The data width converter includes an input to receive an input data stream having an input bit width, a first output to produce a first output data stream having a first output bit width, and a second output to produce a second output data stream having at least a second output bit width. The FEC decoder includes an input to receive the second output data stream having the at least second output bit width. The FEC decoder includes an error correction output to produce one or more error correction values at least partially based on one or more FEC code words in the second output data stream. The one or more error correction values are for correction of one or more symbols, one or more partial symbols, or both, in the first output data stream.

38 Claims, 23 Drawing Sheets

(56) References Cited

U.S. PATENT DOCUMENTS

| | | | |
|---|---|---|---|
| 9,705,640 B2* | 7/2017 | Myung | H03M 13/2707 |
| 2013/0251064 A1* | 9/2013 | Park | H04L 1/0083 |
| | | | 375/295 |
| 2015/0135041 A1 | 5/2015 | O'Connell et al. | |
| 2017/0093526 A1* | 3/2017 | Mula | H04L 1/0053 |
| 2018/0269903 A1* | 9/2018 | Li | H03M 13/13 |
| 2018/0375534 A1* | 12/2018 | Laursen | H03M 13/3723 |
| 2020/0012555 A1 | 1/2020 | Das Sharma | |
| 2021/0013998 A1 | 1/2021 | Sun et al. | |
| 2021/0028795 A1 | 1/2021 | Graumann | |
| 2022/0116059 A1 | 4/2022 | Akkem | |
| 2023/0094363 A1 | 3/2023 | Graumann | |

OTHER PUBLICATIONS

Sun, Phil et al., FEC Architecture and Breakout, IEEE draft, Marvell, Jul. 2015, 13 pages.

Written Opinion of the International Searching Authority of International Application No. PCT/US2023/076137, mailed Jan. 31, 2024, 9 pages.

"IEEE Standard for Ethernet," in IEEE Std 802.3-2018 (Revision of IEEE Std 802.3-2015), pp. 1-5600, Aug. 31, 2018, doi: 10.1109/IEEESTD.2018.8457469.

Lopacinski et al., 100 GB/s Data Link Layer—from a Simulation to FPGA Implementation, Journal of Telecommunications and Information Technology, 2016, pp. 90-100.

Salem et al., ASIC Design and Implementation of 25 Gigab it Ethernet Transceiver with RS_FEC, International Journal of Electrical and Electronic Engineering & Telecommunications, vol. 9, No. 3, May 2020, pp. 148-155.

Zhang et al., Implementation of Modified FEC Codec and High-Speed Synchronizer in 10G-EPON, Sensors & Transducers, vol. 162, Issue 1, IFSA Publishing, S.L., Jan. 31, 2014, pp. 117-123.

Oskorep, John J., Amendment and Response filed on Feb. 21, 2025 with the U.S. Patent and Trademark Office in U.S. Appl. No. 18/481,340, filed Oct. 5, 2023 of Inventor Sailaja Akkem, 12 pages.

* cited by examiner

400

| Clock Count | Converter To Scrambler | Converter To FEC Encoder |
|---|---|---|
| 1 | PIPE | PIPE |
| 2 | PIPE | PIPE |
| 3 | PIPE | PIPE |
| 4 | PIPE | PIPE |
| 5 | PIPE | 70 |
| 6 | PIPE | 70 |
| 7 | 72 | 70 |
| 8 | 72 | 70 |
| 9 | 72 | 70 |
| 10 | 72 | 70 |
| 11 | 72 | 70 |
| 12 | 72 | 70 |
| 13 | 72 | 70 |
| 14 | 72 | 70 |
| 15 | 72 | 70 |
| 16 | 72 | 70 |
| 17 | 72 | 70 |
| 18 | 72 | 70 |
| 19 | 72 | 70 |
| 20 | 72 | 70 |
| 21 | 72 | 70 |
| 22 | 72 | 70 |
| 23 | 72 | 70 |
| 24 | 72 | 70 |
| 25 | 72 | 70 |
| 26 | 72 | 70 |
| 27 | 72 | 70 |
| 28 | 72 | 70 |
| 29 | 72 | 70 |
| 30 | 72 | 70 |

| Clock Count | Converter To Scrambler | Converter To FEC Encoder |
|---|---|---|
| 31 | 72 | 70 |
| 32 | 72 | 70 |
| 33 | 72 | 70 |
| 34 | 72 | 70 |
| 35 | 72 | 70 |
| 36 | 72 | 70 |
| 37 | 72 | 70 |
| 38 | 72 | 70 |
| 39 | 72 | 70 |
| 40 | 72 | 70 |
| 41 | 72 | 70 |
| 42 | 72 | 70 |
| 43 | 72 | 70 |
| 44 | 72 | 70 |
| 45 | 72 | 70 |
| 46 | 72 | 70 |
| 47 | 72 | 70 |
| 48 | 72 | 70 |
| 49 | 72 | 70 |
| 50 | 72 | 70 |
| 1 | 72 | 70 |
| 2 | 72 | 70 |
| 3 | 72 | 70 |
| 4 | 72 | 70 |
| 5 | 72 | 70 |
| 6 | 72 | 70 |
| 7 | Second FEC Frame Starts | |

FIG. 4

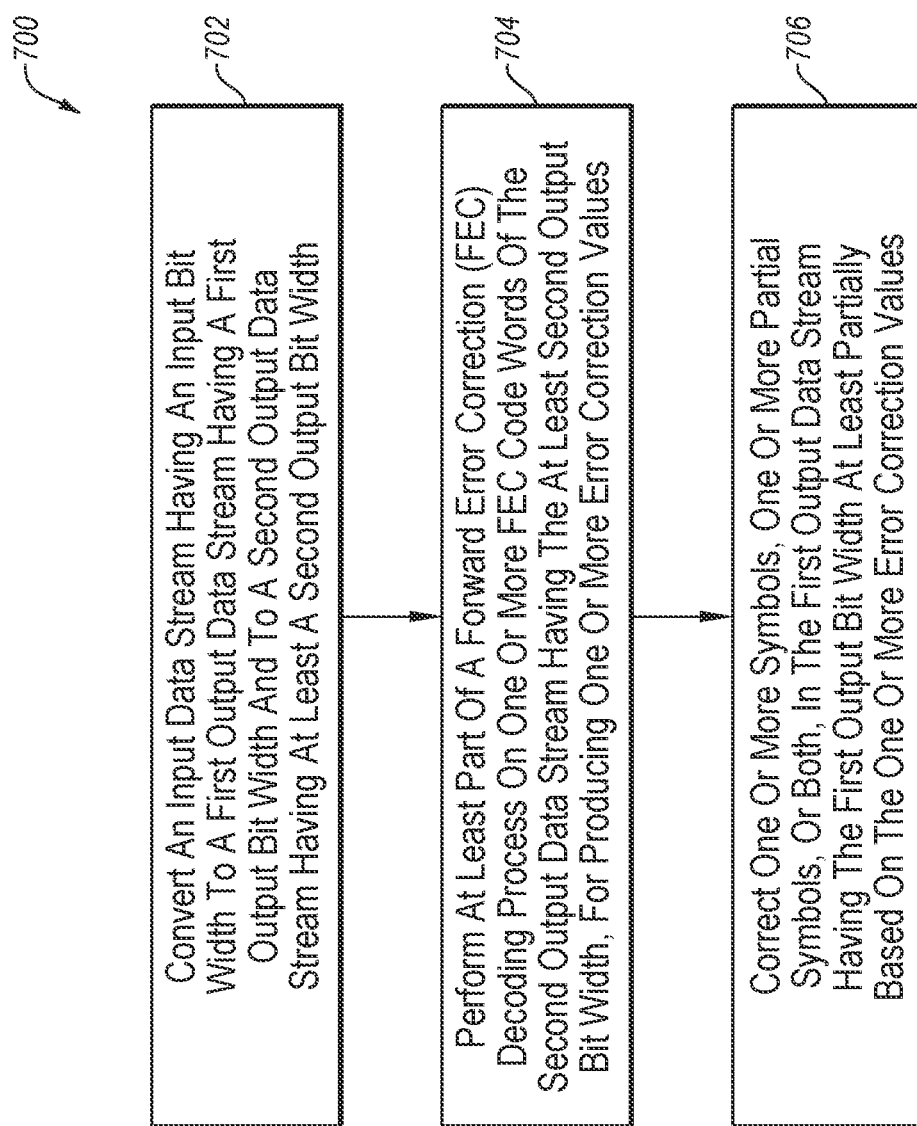

| Clock Count | Input | Converter To FIFO | Converter To Syndrome Calculator |
|---|---|---|---|
| 1 | 72 | 65 | 70 |
| 2 | 72 | 65 | 70 |
| 3 | 72 | 65 | 70 |
| 4 | 72 | 65 | 70 |
| 5 | 72 | 65 | 80 |
| 6 | 72 | 65 | 70 |
| 7 | 72 | 65 | 70 |
| 8 | 72 | 65 | 70 |
| 9 | 72 | 65 | 70 |
| 10 | 72 | 65 | 80 |
| 11 | 72 | 65 | 70 |
| 12 | 72 | 65 | 70 |
| 13 | 72 | 65 | 70 |
| 14 | 72 | 65 | 70 |
| 15 | 72 | 65 | 80 |
| 16 | 72 | 65 | 70 |
| 17 | 72 | 65 | 70 |
| 18 | 72 | 65 | 70 |
| 19 | 72 | 65 | 70 |
| 20 | 72 | 65 | 80 |
| 21 | 72 | 65 | 70 |
| 22 | 72 | 65 | 70 |
| 23 | 72 | 65 | 70 |
| 24 | 72 | 65 | 70 |
| 25 | 72 | 65 | 80 |
| 26 | 72 | 65 | 70 |
| 27 | 72 | 65 | 70 |
| 28 | 72 | 65 | 70 |
| 29 | 72 | 65 | 70 |
| 30 | 72 | 65 | 80 |
| 31 | 72 | 65 | 70 |
| 32 | 72 | 65 | 70 |
| 33 | 72 | 65 | 70 |
| 34 | 72 | 65 | 70 |
| 35 | 72 | 65 | 80 |
| 36 | 72 | 65 | 70 |
| 37 | 72 | 65 | 70 |
| 38 | 72 | 65 | 70 |
| 39 | 72 | 65 | 70 |
| 40 | 72 | 65 | 80 |
| 41 | 72 | 65 | 70 |
| 42 | 72 | 65 | 70 |
| 43 | 72 | 65 | 70 |
| 44 | 72 | 65 | 70 |
| 45 | 72 | 65 | 80 |
| 46 | 72 | 65 | 70 |
| 47 | 72 | 65 | 70 |
| 48 | 72 | 65 | 70 |
| 49 | 72 | 65 | 70 |
| 50 | 72 | 75 | 80 |

FIG. 8

Look Up Table (LUT)

| Clock Count | Variable Latency Prediction | Clock Count | Variable Latency Prediction |
|---|---|---|---|
| 1 | 1 | 26 | 3 |
| 2 | 1 | 27 | 3 |
| 3 | 1 | 28 | 3 |
| 4 | 1 | 29 | 3 |
| 5 | 1 | 30 | 3 |
| 6 | 1 | 31 | 4 |
| 7 | 1 | 32 | 4 |
| 8 | 1 | 33 | 4 |
| 9 | 1 | 34 | 4 |
| 10 | 1 | 35 | 4 |
| 11 | 2 | 36 | 4 |
| 12 | 2 | 37 | 4 |
| 13 | 2 | 38 | 4 |
| 14 | 2 | 39 | 4 |
| 15 | 2 | 40 | 4 |
| 16 | 2 | 41 | 4 |
| 17 | 2 | 42 | 4 |
| 18 | 2 | 43 | 5 |
| 19 | 2 | 44 | 5 |
| 20 | 2 | 45 | 5 |
| 21 | 2 | 46 | 5 |
| 22 | 2 | 47 | 5 |
| 23 | 3 | 48 | 5 |
| 24 | 3 | 49 | 5 |
| 25 | 3 | 50 | 5 |

*FIG. 9*

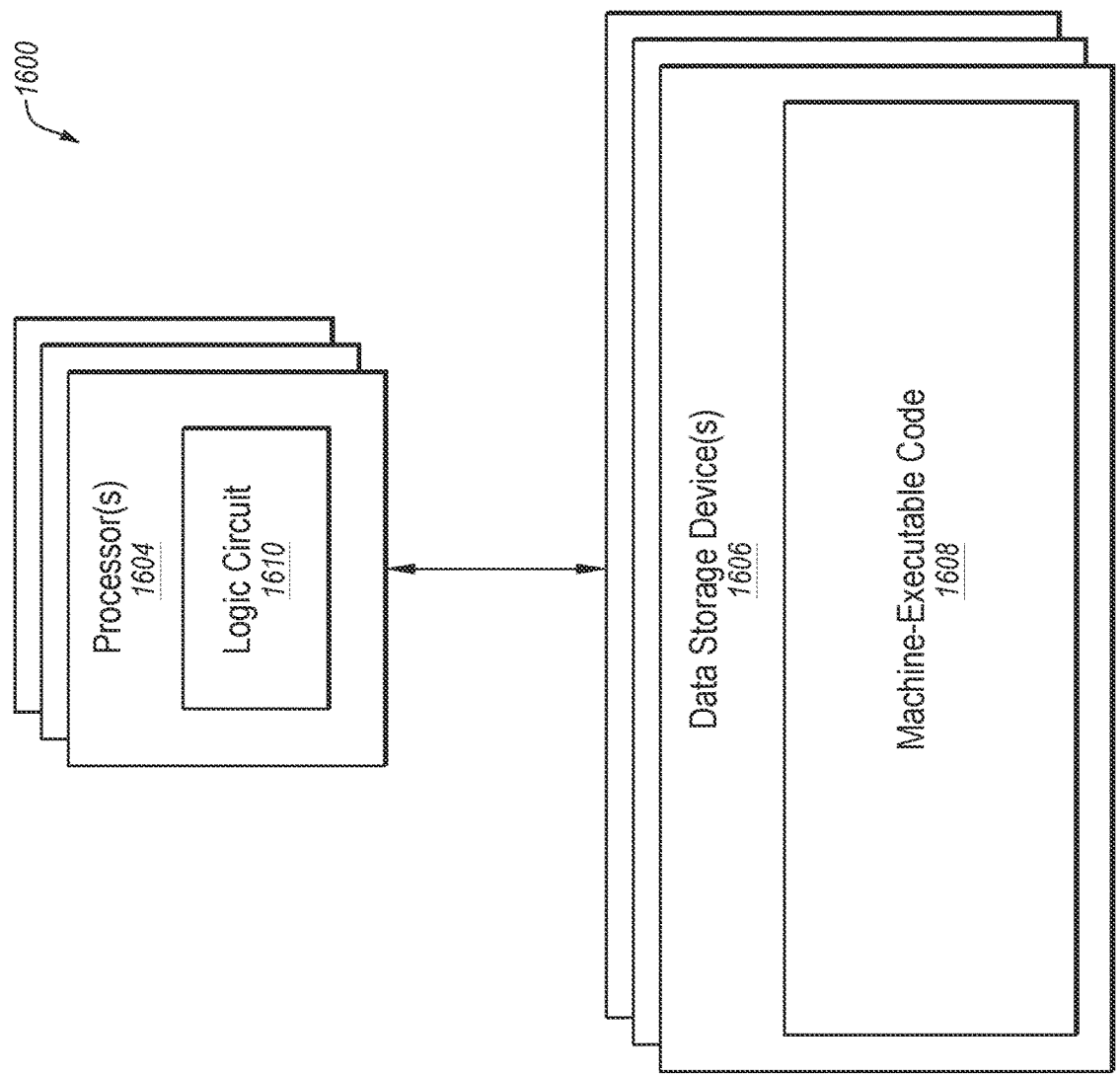

APPARATUS AND METHOD FOR PROCESSING RECEIVE DATA IN A RECEIVE DATA PATH INCLUDING PARALLEL FEC DECODING

CROSS-REFERENCE TO RELATED APPLICATION

This application claims the benefit of the priority date of U.S. Provisional Patent Application No. 63/378,690, filed Oct. 7, 2022, and titled "FEC DECODER IMPLEMENTATION FOR LOW AND CONSTANT LATENCY," the disclosure of which is incorporated herein in its entirety by this reference.

TECHNICAL FIELD

This disclosure relates generally to transceivers, and more particularly to transceiver processing of data for communications including encoding and/or decoding for error correction of data. Additionally, apparatuses and methods are disclosed.

BACKGROUND

Various applications require communications at high data rates over relatively small distances. As one or more examples, automotive in-car systems, certain industrial systems, and smart-home systems would benefit from these types of communications. Several types of protocols and communication media have been proposed and developed for such applications. Innovative, efficient design solutions are often needed to adapt functional components to these developments.

BRIEF DESCRIPTION OF THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

FIG. 4 is a table of numbers of transferred data bits per clock cycle associated with operation of a data width converter in the transmit PHY of FIG. 2, according to one or more examples.

FIG. 7A is a flowchart depicting a process to process receive data in a receive data path including parallel FEC decoding, according to one of more examples.

FIG. 8 is a table of numbers of transferred data bits per clock cycle associated with operation of a data width converter in the receive PHY of FIGS. 6A-6C, according to one or more examples.

FIG. 9 is a look-up table (LUT) for a latency predictor associated with the receive PHY, according to one or more examples.

FIG. 16 is a block diagram of circuitry that, in some examples, may be used to implement various functions, operations, acts, processes, and/or methods disclosed herein.

DETAILED DESCRIPTION

Figure 1:
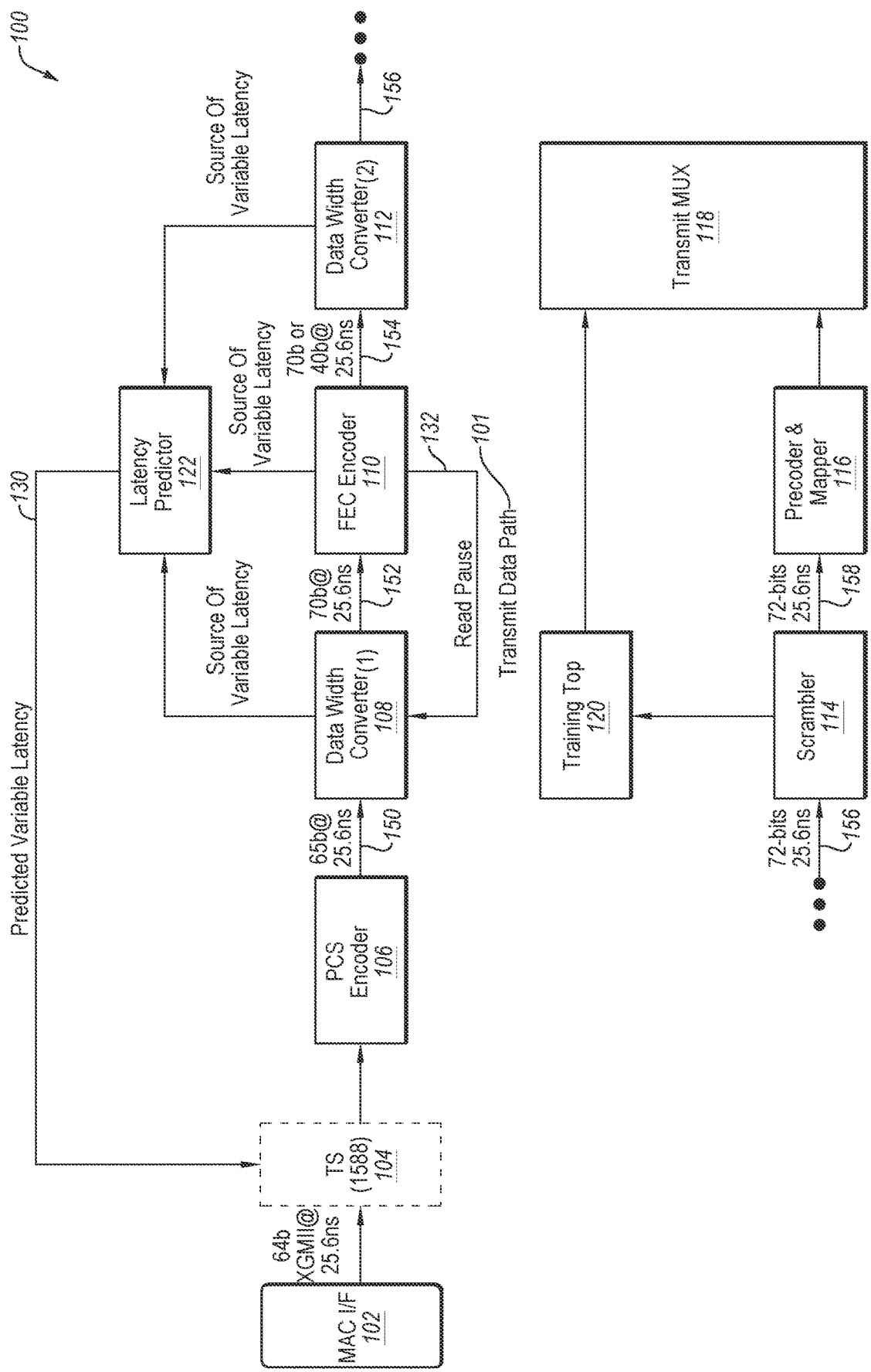
FIG. 1 is a schematic block diagram of a transmit physical layer (PHY) of a transmitter that is known by the inventor of this disclosure.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples enabled herein may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. In some instances, similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an examples or this disclosure to the specified components, steps, features, functions, or the like.

It will be readily understood that the components of the examples as generally described herein and illustrated in the drawings could be arranged and designed in a wide variety of different configurations. Thus, the following description of various examples is not intended to limit the scope of the present disclosure, but is merely representative of various examples. While the various aspects of the examples may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In a traditional approach to the design of an Ethernet physical layer (PHY) transceiver, if a Forward Error Correction (FEC) block is integrated or in-line with the data path, then a majority of the data path operates on integer multiples of the FEC symbol width. However, the outgoing data width is generally not an integer multiple of the FEC symbol width, and therefore one or more additional data width converters (e.g., gearboxes) and read-pause mechanisms may be employed. For Institute of Electrical and Electronics Engineers (IEEE) 802.3ch, 2.5GT1 Automotive Ethernet PHY, for example, the FEC symbol width is ten (10) bits, the data path width may be either seventy (70) bits or eighty (80) bits, and the outgoing data width is sixty-five (65) bits.

Such an approach introduces latency in the communication of Ethernet packets. This latency is a data-dependent latency that may change from one packet to the next, and therefore is a variable latency. The Ethernet packets are timestamped for time synchronization in the network according to IEEE 1588. A packet's timestamp point (a timestamp point is also sometimes referred to as a "reference plane") is set to be the edge of a device, typically a point that corresponds to the Media Dependent Interface (MDI). Following a packet at the edge of a device may be challenging, so IEEE 802.3 specifies that a first timestamp is generated when a packet crosses the Media Independent interface (MII) and then adjusted by an amount that represents the path data delay to calculate a second, final timestamp corresponding to the MDI reference plane.

For proper timestamping, there should be a guaranteed fixed latency in the PHY, or alternatively, the provision of a predictor logic for calculating the amount of variable latency incurred per packet for adjustment of timing discussed above. For example, a three (3) clock adjustment may be made for a first packet, a ten (10) clock adjustment may be made for a second packet, and so on.

Predictor logic tends to be relatively complex, as it has to estimate the delay of the packet by accurately predicting the start of the Ethernet packet that is transferred through, e.g., two (2) data width converters and the FEC block. Such complex predictor logic is made even more complex when modules are configured to pause the data path. Further, it is often desirable to reduce the overall latency of the packets in the PHY, e.g., for compliance with time-sensitive networking (TSN) standards and real-time communication, without limitation.

Thus, in the traditional approach, multiple data width converters may be utilized. In some implementations of the traditional approach, certain modules may pause communications. This pausing introduces latency, which may further complicate the predictor logic. In a transmit data path, the latency of a frame is at least partially determined by the number of data width converters and the FEC block. Thus, the traditional approach includes multiple sources of variable latency. In a receive data path, the latency of a frame is at least partially determined by the depth of the first-in-first-out (FIFO) buffer, which in turn is determined by the time it takes the FEC decoder to correct the frame. The time it takes the FEC decoder to correct a frame is dominated by an error locator polynomial (ELP) algorithm of an error locator. Further, the FIFO buffer width used in the FEC decoder should align with the FEC symbol width, which results in using several unwanted flops, even though only a single FEC frame must be stored.

One or more examples relate, generally, to reducing latency and variation of latency. One or more examples relate to a transmitter portion of a PHY transceiver capable of reducing latency and variation of latency. In one or more examples, the transmitter portion is capable of reducing the latency and latency variation for compliance with TSN and IEEE 1588. In one or more examples, the transmitter portion includes a latency predictor to determine a latency value that may be utilized to represent a predicted latency. In one or more examples, the latency predictor may be or include a look up table (LUT). In one or more examples, the transmitter portion has a relatively reduced area compared to the traditional approach.

In one or more examples, the transmitter portion includes a FEC encoder in parallel with the transmit data path. In one or more examples, the FEC encoder is operative, at least in substantial part, separately and independently from the transmit data path. In one or more examples, the FEC encoder is operative on a symbol width ("symbol width" is data width in terms of number of symbols) that is different from a symbol width associated with the data path. In one or more examples, the number of data width converters in the transmit data path is one (1) data width converter, which reduces the latency incurred in the transmit data path otherwise caused by additional data width converters. In one or more examples, the transmit data path provides a guaranteed fixed latency in (e.g., most or all, without limitation) modules of the transmitter portion of the PHY transceiver, apart from the (e.g., single, without limitation) data width converter.

One or more examples relate to a receiver portion of a PHY transceiver capable of reducing latency and variation of latency. In one or more examples, the receiver portion is capable of reducing the latency and latency variation for compliance with TSN and IEEE 1588. In one or more examples, the receiver portion includes a latency predictor to determine the latency. In one or more examples, the latency predictor may be or include a look up table (LUT). In one or more examples, the receiver portion of the PHY transceiver has a relatively reduced area as compared to the traditional approach.

In one or more examples, the receiver portion includes a FEC decoder in parallel with the receive data path. In one or more examples, the FEC decoder is operative, at least in substantial part, separately and independently from the receive data path. In one or more examples, the FEC encoder is operative on a symbol width that is different from a symbol width associated with the receive data path. In one or more examples, the number of data width converters in the receiver data path is one (1) data width converter. In one or more examples, the receive data path provides a guaranteed fixed latency in (e.g., most or all, without limitation) modules of the receiver portion of the PHY transceiver apart from the (e.g., single, without limitation) data width converter.

In one or more examples, parallel FEC decoder processing may include a symbol error corrector to correct partial symbols and an error magnitude generator to select the number of bits of error magnitude to provide to the symbol error corrector. Further, in one or more examples, a syndrome calculator of the parallel FEC decoder may be one that operates on a variable number of symbols (e.g., seven (7) or eight (8) FEC symbols per clock). Further, in one or more examples, an ELP algorithm of the FEC decoder may be set to execute at a different (e.g., higher, without limitation) clock rate than the clock rate of the receive data path.

FIG. 1 shows a schematic block diagram of a transmit physical layer (PHY) of a transmitter (referred to herein as a "transmitter portion 100") that is known by the inventor of this disclosure. The transmitter portion 100 may be at least part of an Ethernet physical layer transceiver (Ethernet PHY) for transmitting data or Ethernet frames. For example, transmitter portion 100 may be compliant with the Institute of Electrical and Electronics Engineers (IEEE) 802.3ch, 2.5GT1 Automotive Ethernet PHY, and more specifically, the "IEEE Standard for Ethernet—Amendment 8: Physical Layer Specifications and Management Parameters for 2.5 Gb/s, 5 Gb/s, and 10 Gb/s Automotive Electrical Ethernet," IEEE 802.3ch-2020, June 2020, for accommodation of the next evolution of in-vehicle networks.

Transmitter portion 100 comprises (from left to right in the figure) a media access control (MAC) interface (I/F) (MAC I/F) 102, timestamp circuitry 104, a physical coding sublayer (PCS) encoder 106, a data width converter 108 (which may also be referred to herein as a "gearbox 108"), an FEC encoder 110, a data width converter 112 (which may also be referred to herein as a "gearbox 112"), a scrambler 114, a precoder and mapper 116, and a transmitter multiplexer (MUX) 118. Scrambler 114 may include an output 158 to a training top module 120, which is coupled to transmit MUX 118 for training path selection.

As depicted in FIG. 1, many of the modules of transmitter portion 100 are in-line (e.g., arranged serially, sequentially, or both without limitation) with a transmit data path 101 for the communication of data from a link layer to a transmission medium (e.g., a shared transmission medium such as a twisted pair, without limitation). In particular, FEC encoder 110 is integrated or in-line with transmit data path 101. FEC encoder 110 operates (e.g., processes symbols, without limitation) on an FEC symbol width. The FEC symbol width of FEC encoder 110 is ten (10) bits.

Most of transmit data path 101 operates on integer multiples of the FEC symbol width. However, the subsequently-desired or outgoing data width (e.g., seventy-two (72) bits) is not an integer multiple of the FEC symbol width. As the outgoing data width is not an integer multiple of the FEC symbol width, one or more additional data width converters and read-pause mechanisms are employed. For example, transmit data path 101 includes (e.g., the additional) data width converter 112, and FEC encoder 110 may produce a "read pause" to data width converter 108 via an output 132 when needed.

As shown in FIG. 1, data width converter 108 includes an input to receive a data stream 150 at a first bit width and an output to produce a data stream 152 at a second bit width. FEC encoder 110 includes an input to receive the data stream 152 at the second bit width and an output to produce a data stream 154 at the (same) second bit width. Data width converter 112 includes an input to receive data stream 154 at the second bit width and an output to produce a data stream 156 at a third bit width.

In support of 2.5GT1, the FEC symbol width is ten (10) bits, the first bit width of data stream 150 is sixty-five (65) bits (e.g., @25.6 ns), the second bit width of data streams 152 and 154 (e.g., to and from FEC encoder 110, respectively) is seventy (70) bits (e.g., @25.6 ns), and the third bit width of data stream 156 is seventy-two (72) bits (e.g., @25.6 ns).

Prior to processing by FEC encoder 110, Ethernet packets may be timestamped by timestamp circuitry 104 (named "TS 1588 104" in FIG. 1). Timestamping of the Ethernet packets provides for time synchronization in the network for compliance with IEEE 1588 (e.g., Precision Time Protocol (PTP), without limitation). More specifically, timestamp circuitry 104 receives and timestamps Ethernet packets from MAC I/F 102 in a data stream having a bit width of sixty-four (64) bits, according to 10 Gigabit Media Independent Interface (XGMII). XGMII is an interface for high-speed serial data systems for communication between the reconciliation sublayer (RS) and the PCS for 10 Gigabits per second (Gbps) operation.

The modules and arrangement of the modules in transmitter portion 100 introduce latency in the communication of Ethernet packets. This latency is a variable latency that changes from one packet to the next. For compliance with time-sensitive networking (TSN) standards and real-time Ethernet communications, it is desirable to reduce the overall latency of the packets in the PHY. For proper timestamping by timestamp circuitry 104, there should be a guaranteed fixed latency in the PHY, or alternatively, the provision of a predictor logic for calculating an amount of variable latency incurred per packet to properly adjust the timing.

Transmitter portion 100 includes a latency predictor 122 having an output 130 operably coupled to timestamp circuitry 104 for timing adjustment. However, latency predictor 122 includes complex predictor logic ("1588 predictor logic") to produce, at an output 130, a predicted variable latency based on multiple sources of variable latency as indicated in the figure. In general, the latency in transmit data path 101 is determined by the number of gearboxes and the FEC block. Latency predictor 122 has relatively complex logic to estimate the delay of the Ethernet packet by determining a start of the packet transferred through the two (2) data width converters 108 and 112 and FEC encoder 110. Latency predictor 122 is made even more complex when FEC encoder 110 pauses transmit data path 101 at data width converter 108 via output 132.

Figure 2:
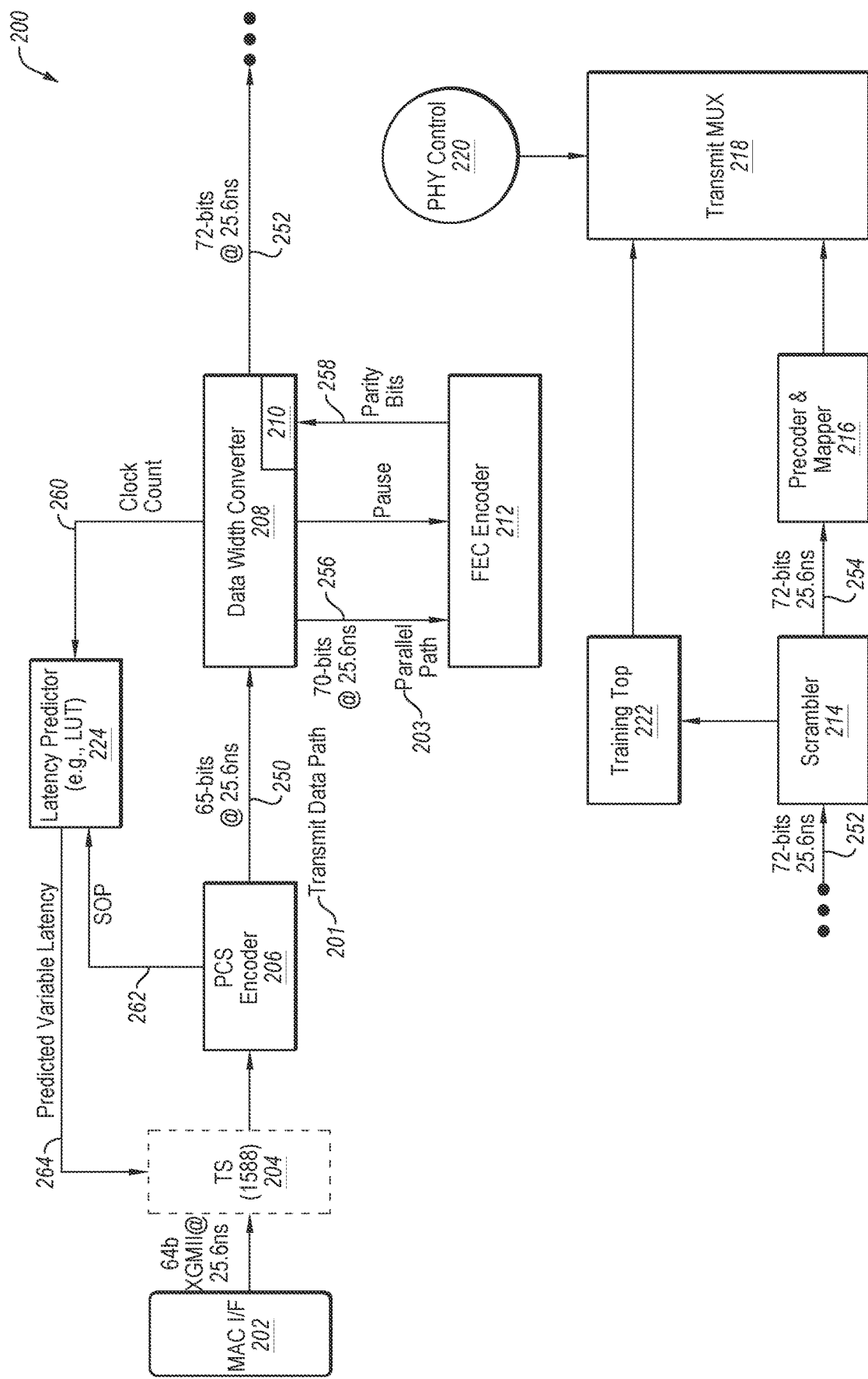
FIG. 2 is a schematic block diagram of a transmit PHY of a transmitter, according to one or more examples of the disclosure.

FIG. 2 is a schematic block diagram of a transmit physical layer (PHY) of a transmitter (referred to herein as a "transmitter portion 200"), according to one or more examples of the disclosure. In one or more examples, transmitter portion 200 may be at least part of an Ethernet physical layer transceiver (Ethernet PHY) for transmitting data (e.g., one or more symbols, without limitation), e.g., of Ethernet frames (e.g., an Ethernet frame is transmitted as a series of symbols on a physical layer, without limitation). In a specific, non-limiting example, transmitter portion 200 is compliant with the IEEE 802.3ch, 2.5GT1 Automotive Ethernet PHY, as described earlier above.

Transmitter portion 200 may include a transmit data path 201 for the communication of data from a link layer to a transmission medium. Transmitter portion 200 comprises (from left to right in the figure) a MAC I/F 202, timestamp circuit 204, a PCS encoder 206, a data width converter 208 (or "gearbox"), an FEC encoder 212, a scrambler 214, a precoder and mapper 216, and a transmit MUX 218. Precoder and mapper 216 produces pulse-amplitude modulated (PAM) (e.g., 2-level) (PAM-2) signals based on the received data stream. For training, scrambler 214 includes an output to a training top module 222 which is coupled to a selectable input of transmit MUX 218 (a selectable input for selection of a training path). A control signal 220 ("PHY control 220") from a PHY controller (controller not depicted) is input to transmit MUX 218 for data or training path selection.

As depicted in FIG. 2, data width converter 208 is in transmit data path 201, and FEC encoder 212 is in parallel with transmit data path 201. As an illustrative example, FEC encoder 212 may be arranged in a parallel path 203 that is in parallel with at least a portion of transmit data path 201 and/or data width converter 208. FEC encoder 212 may operate, at least in substantial part, separately and independently from transmit data path 201. Given the arrangement, transmit data path 201 provides for a fixed latency in data conveyance.

In one or more examples, transmit data path 201 includes (e.g., only) a single data width converter (i.e., data width converter 208). Although "single" in transmit data path 201, data width converter 208 may be made of two or more separate data width converter circuits to produce the two respective output data streams (first and second output data streams 252 and 256), or alternatively, utilize shared circuitry to produce the different streams.

More specifically as shown in FIG. 2, an input of data width converter 208 is at least partially responsive to an output of PCS encoder 206. Data width converter 208 includes an input to receive an input data stream 250 (e.g., input data stream 250 is at least partially based on an output of PCS encoder 206) at an input bit width, a first output to produce a first output data stream 252 at a first output bit width, and a second output to produce a second output data stream 256 at a second output bit width. In one or more examples, the input bit width, the first output bit width, and the second output bit width are different from each other.

Scrambler 214 includes an input to receive the first output data stream 252 at the first output bit, and includes an output to produce a scrambled output data stream 254 at least partially based on first output data stream 252. Scrambled output data stream 254 is provided for subsequent processing by precoder and mapper 216 and transmit MUX 218 for transmission. FEC encoder 212 includes an input to receive the second output data stream 256 at the second output bit width, and includes an output to produce parity bits 258 at least partially based on multiple received symbols of the second output data stream 256. The parity bits 258 are for insertion in the first output data stream 252 having the first output bit width. The first output data stream 252 received at the input of scrambler 214 includes the inserted parity bits from the parity bits 258 produced by FEC encoder 212.

More particularly, the output of FEC encoder 212 produces parity bits 258 for respective ones of the multiple received symbols of the second output data stream 256, for insertion at respective intervals of the first output data stream 252. A parity insertion circuit 210 may insert the parity bits 258. In one or more examples, parity insertion circuit 210 may be part of data width converter 208 or separate therefrom (e.g., an input of parity insertion circuit 210 may receive an output of data width converter 208, insert respective parity bits 258 in the received output of data width converter 208, and produce the second output data stream 256 including respective parity bits, without limitation). In one or more examples, parity insertion circuit 210 inserts the generated parity bits at the respective intervals of the first output data stream 252.

The output of FEC encoder 212 produces the parity bits 258 based on the multiple received symbols (e.g., k symbols, where k=360) received over a number of clock cycles, where respective ones of the k symbols have a symbol width of s bits (e.g., s=10 bits). Thus, in one or more examples, FEC encoder 212 operates on a symbol width that is different from the requirements of transmit data path 201, and keeps its generated parity bits ready for insertion before the next FEC frame starts. In one or more examples, the second output bit width of second output data stream 256 is an integer multiple of the symbol width of FEC encoder 212. In one or more examples, the input bit width of input data stream 250 is not an integer multiple of the symbol width, and/or the first output bit width of first output data stream 252 is not an integer multiple of the symbol width.

In one or more examples, little to no latency is incurred by FEC encoder 212 arranged in parallel path 203. In one or more examples, the modules and the arrangement of modules in transmitter portion 200 reduce the latency in the communication of Ethernet packets (e.g., by one (1) clock), and/or reduce or eliminate the variability of the latency in transmit data path 201.

In one or more examples, transmitter portion 200 of the PHY transceiver is configured in accordance with IEEE 802.3ch 2.5GT1. For compliance with 2.5GT1, the symbol width is ten (10) bits, the input bit width of input data stream 250 is sixty-five (65) bits (e.g., @25.6 ns), the first output bit width of first output data stream 252 (e.g., to scrambler 214) is seventy-two (72) bits (e.g., @25.6 ns), and the second output bit width of second output data stream 256 (e.g., to FEC encoder 212) is seventy (70) bits (e.g., @25.6 ns). Scrambler 214 outputs the scrambled output data stream 254 also at the first output bit width of seventy-two (72) bits (e.g., @25.6 ns). Each IEEE 802.3ch FEC frame runs for fifty (50) clocks.

In one or more examples, FEC encoder 212 is a Reed-Solomon (RS) FEC encoder utilizing an RS code (e.g., parity bits are an RS code, without limitation). In one or more examples, FEC encoder 212 utilizes an RS code of RS(360,326). In one or more examples, an RS code may be represented by RS(n, k), where n=the total number of symbols in the FEC code word, k=the number of data symbols for data, and (n-k)=the number of parity symbols for parity.

In one or more other examples, transmitter portion 200 is configured in accordance with one or more different standards, bit rates, bit widths, speeds, and/or codes.

In one or more examples, FEC encoder 212 may be a distributed symbol processing FEC encoder, for example, an FEC encoder that operates on a variable number of symbols from one clock (e.g., one or more first clocks) to the next (e.g., one or more second clocks), for matching the incoming data rate. As one example, FEC encoder 212 may operate on seven (7) symbols for one or more first clocks, followed by eight (8) symbols for one or more second clocks. As one example, FEC encoder 212 may operate on six (6) symbols for one or more first clocks, followed by seven (7) symbols for one or more second clocks.

In one or more examples, data width converter 208 may pause FEC encoder 212 (e.g., regularly or periodically), if and as desired or needed, without introducing any variable latency in transmit data path 201. For example, data width converter 208 may pause FEC encoder 212 once every five (5) or six (6) cycles (e.g., for 2.5GT1). In the traditional approach (i.e., using the integrated FEC encoder in FIG. 1), any pausing toward the FEC encoder would halt the conveyance of the data downstream, or would not provide sufficient bandwidth for insertion of the parity bits.

Timestamp circuit 204 is in transmit data path 201 to timestamp data stream communications (e.g., per TSN, IEEE 1588 (PTP)). More specifically, timestamp circuit 204 receives and timestamps Ethernet packets from MAC I/F 202 in a data stream having a bit width of sixty-four (64) bits, according to XGMII. For any latency adjustments, a latency predictor 224 is operably coupled to data width converter 208, and timestamp circuit 204 is operably coupled to latency predictor 224. In addition, in one or more examples, latency predictor 224 receives a start of packet (SOP) indication at an output 262 of PCS encoder 206. Latency predictor 224 selects a latency value responsive to a clock count value provided at an output 260 of data width converter 208. In one or more examples, latency predictor 224 comprises a look-up table (LUT) of latency values respectively associated with clock count values.

Timestamp circuit 204 receives a latency value 264 (named "predicted latency value 264" in FIG. 2) from latency predictor 224, and adjusts a timing of timestamp circuit 204 at least partially based on the latency value 264. In one or more examples, the latency values in the look-up table are fixed latency values or predetermined latency values that depend on the (e.g., current, relative) clock count. The current, relative clock count may be relative to a repeating cycle of clock counts, for example, a repeating cycle of 1 to 50 clock counts, or other clock count range. A specific, non-limiting example of such a look-up table for the latency predictor associated with the receiver portion of the PHY transceiver is shown and described later in relation to FIG. 9.

With reference to the specific, non-limiting example of FIG. 4, a table 400 of numbers of transferred data bits per clock cycle associated with operation of data width converter 208 of FIG. 2 is shown. The numbers of transferred data bits per clock cycle include the numbers of transferred data bits from the data width converter to the scrambler ("converter-to-scrambler"), and the numbers of transferred data bits from the data width converter to the FEC encoder ("converter-to-FEC-encoder"). The converter-to-scrambler column in table 400 is associated with first output data stream 252 having the first output bit width (FIG. 2) (e.g., seventy-two (72) bits); and the converter-to-FEC-encoder column in table 400 is associated with second output data stream 256 having the second output bit width (FIG. 2) (e.g., seventy (70) bits or seven (7) symbols).

The values in the "clock count" column respectively indicate a current clock count associated with a repeating cycle of clock counts, for example, a repeating cycle of 1 to 50 clock counts, or other clock count range. Here, the FEC encoder receives seven (7) symbols per clock cycle at a symbol width of ten (10) bits, for a total of seventy (70) bits per clock cycle. Using the RS code of RS(360, 326), the FEC encoder operates to produce three-hundred and forty (340) parity bits (or thirty-four (34) parity symbols at a 10-bit symbol width) per fifty (50) clock cycles, based on 3260 data bits or 326 10-bit data symbols (i.e., 70 data bits×46 clock cycles+40 data bits×1 clock cycle=3260 data bits or 326 10-bit data symbols). The indication of "P" in the converter-to-FEC-encoder column indicates the insertion of the generated parity bits of the (e.g., first) FEC frame and/or FEC code word. In the clock count cycle that precedes the parity bit insertion of "P," the FEC encoder receives only forty (40) bits or four (4) symbols. The indication of "Second FEC Frame starts" in the converter-to-scrambler column indicates the start of the next (e.g., second) FEC frame.

Figure 3A:
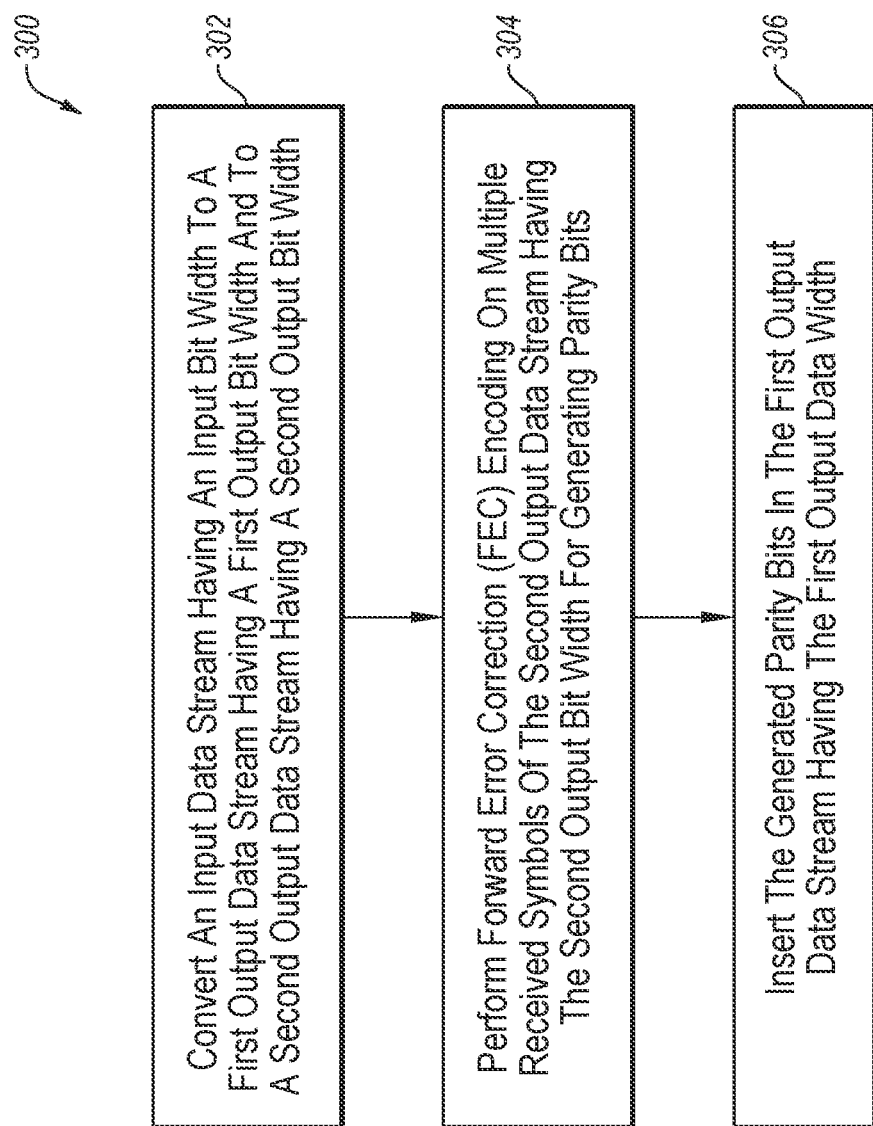
FIG. 3A is a flowchart depicting a process to process transmit data in a transmit data path including parallel Forward Error Correction (FEC) encoding, according to one or more examples.

FIG. 3A is a flowchart depicting a process 300 to process transmit data in a transmit data path including parallel FEC encoding, according to one or more examples.

In one or more examples, process 300 may include converting an input data stream having an input bit width to a first output data stream having a first output bit width and to a second output data stream having a second output bit width, in an act 302. In one or more examples, the input bit width, the first output bit width, and the second output bit width are different from each other. In one or more examples, act 302 may include multiple acts of conversion.

In one or more examples, process 300 may include performing FEC encoding on multiple received symbols of the second output data stream having the second output bit width for generating parity bits, in an act 304.

In one or more examples, process 300 may include inserting the generated parity bits in the first output data stream, in an act 306. In one or more examples, process 300 may include generating parity bits for respective ones of the multiple received symbols of the second output data stream for insertion at respective intervals of the first output data stream.

In one or more examples, converting (e.g., in act 302) the input data stream having the input bit width to the first output data stream having the first output bit width is performed in a transmit data path, and performing (e.g., in act 304) at least part of the FEC encoding is performed in parallel with the transmit data path. In one or more examples, the transmit data path provides a fixed latency in communications of the first output data stream.

In one or more examples, the input data stream having the input bit width may be received from a PCS encoder. In one or more examples, the first output data stream having the first output bit width may include the inserted parity bits, and may subsequently be scrambled (e.g., by a scrambler, without limitation).

In one or more examples, performing (e.g., in act 304) the FEC encoding may involve performing the FEC encoding on the multiple received symbols comprising k symbols (e.g., received over multiple clock cycles), where respective ones of the k symbols comprising a symbol width of s bits. Here, 'k' is an integer greater than or equal to 1. In one or more examples, the second output bit width is a multiple of the symbol width of s bits. In one or more examples, the symbol width is ten (10) bits. In one or more examples, the input bit width is sixty-five (65) bits, the first output bit width is seventy-two (72) bits, and the second output bit width is seventy (70) bits.

In one or more examples, process 300 may include signaling a latency predictor with a clock count value. The latency predictor includes a look-up table of latency values respectively associated with clock count values. In one or more examples, process 300 may include adjusting a timing of a timestamping process for timestamping of data stream communications at least partially based on a latency value received from the latency predictor, where the latency value is responsive to the clock count value.

Figure 3B:
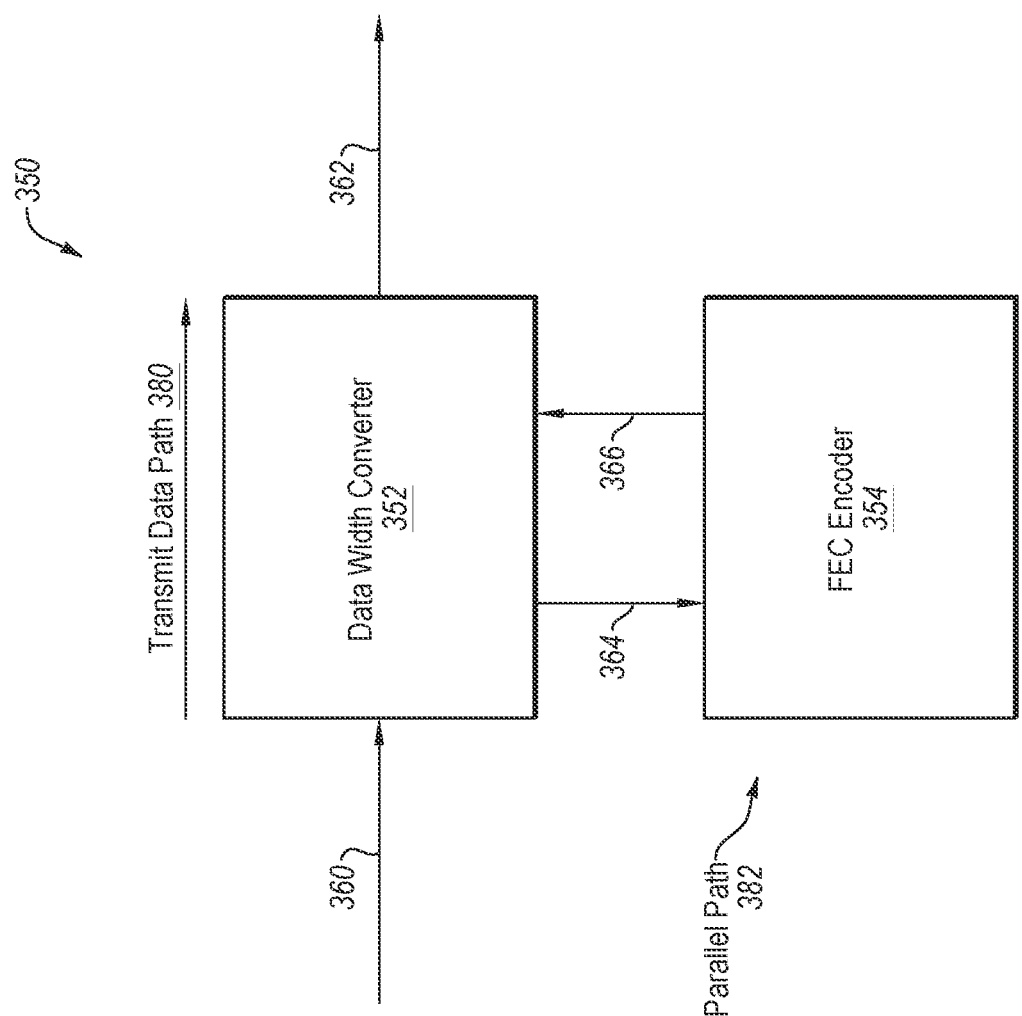
FIG. 3B is an apparatus to process transmit data in a transmit data path including parallel FEC encoding, according to one or more examples.

FIG. 3B is an apparatus 350 to process transmit data in a transmit data path including parallel FEC encoding, according to one or more examples. In one or more examples, apparatus 350 includes a data width converter 352 and an FEC encoder 354. In one or more examples, data width converter 352 is in a transmit data path 380, and FEC encoder is in parallel with transmit data path 380 (e.g., in a parallel path 382).

Data width converter 352 includes an input to receive an input data stream 360 at an input bit width, a first output to produce a first output data stream 362 at a first output bit width, and a second output to produce a second output data stream 364 at a second output bit width. FEC encoder 354 includes an input to receive the second output data stream 364 at the second output bit width. FEC encoder 354 includes an output 366 to produce parity bits at least partially based on multiple received symbols of the second output data stream 364 having the second output bit width. The parity bits are for insertion in the first output data stream 362 having the first output bit width.

Figure 5A:
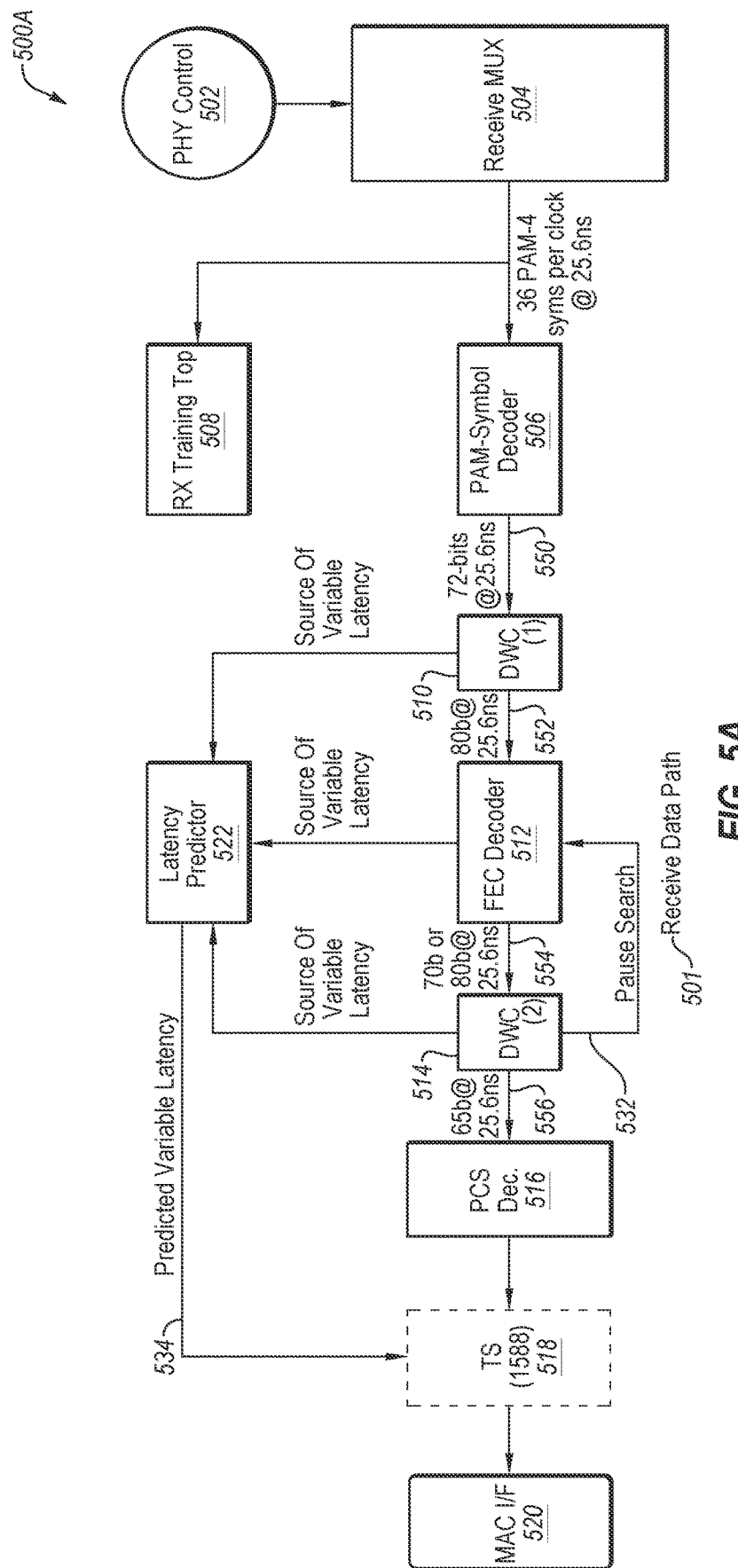
FIG. 5A is a schematic block diagram of a receive physical layer (PHY) of a receiver that is known by the inventor of this disclosure.

FIG. 5A is a schematic block diagram of a receive physical layer (PHY) of a receiver 500A (referred to herein as a "receiver portion 500A") that is known by the inventor of this disclosure. The receiver portion 500A may be at least part of an Ethernet physical layer transceiver (Ethernet PHY) for receiving data or Ethernet frames. For example, receiver portion 500A may be compliant with IEEE 802.3ch, 2.5GT1 Automotive Ethernet PHY, and more specifically, the "IEEE Standard for Ethernet—Amendment 8: Physical Layer Specifications and Management Parameters for 2.5 Gb/s, 5 Gb/s, and 10 Gb/s Automotive Electrical Ethernet," IEEE 802.3ch-2020, June 2020, for accommodation of the next evolution of in-vehicle networks.

Receiver portion 500A comprises (from right to left in the figure) a receiver MUX 504, a symbol decoder 506, a data width converter 510 ("gearbox 510"), an FEC decoder 512, a data width converter 514 ("gearbox 514"), a PCS decoder 516, timestamp circuitry 518, and MAC I/F 520. From receiver MUX 504, pulse-amplitude modulated (PAM) (e.g., 4-level) (PAM-4) signals (per clock) are received for processing (e.g., via symbol decoder 506 which is a PAM-symbol decoder). A training top module 508 is coupled to receive the signals from receiver MUX 504, for training of the scrambling/descrambling. A PHY controller 502 is input to receiver MUX 504 for data or training path selection.

As depicted in FIG. 5A, many of the modules of receiver portion 500A are in-line with a receive data path 501 for processing the incoming data stream from the transmission medium to a link layer for further processing. In particular, FEC decoder 512 is integrated or in-line with receive data path 501. Note that FEC decoder 512 operates on an FEC symbol width. In one or more examples, the FEC symbol width is ten (10) bits.

Given the above, most of receive data path 501 operates on integer multiples of the symbol width. However, the subsequently-desired data width (e.g., sixty-five (65) bits) is not an integer multiple of the symbol width. As the subsequently-desired data width is not an integer multiple of the symbol width, one or more additional data width converters and read-pause mechanisms may be employed. For example, receive data path 501 may include (the additional) data width converter 514. Data width converter 514 may further produce a "pause search" signal to FEC decoder 512 at an output 532 when needed. For example, data width converter 514 may produce a pause search signal to pause searching every 9/10/18 clocks, without limitation.

More specifically, data width converter 510 includes an input to receive a data stream 550 at a first bit width and an output to produce a data stream 552 at a second bit width. FEC decoder 512 includes an input to receive the data stream 552 at the second bit width and an output to produce a data stream 554 at the (same) second bit width or an alternative second bit width. Data width converter 514 includes an input to receive data stream 554 at the second bit width (or the alternative second bit width) and an output to produce a data stream 556 at a third bit width.

In support of 2.5GT1, the FEC symbol width is ten (10) bits, the first bit width of data stream 550 is seventy-two (72) bits (e.g., @25.6 ns), the second bit width of data stream 552 is eighty (80) bits (e.g., @25.6 ns), the second bit width of data stream 554 is eighty (80) bits (e.g., @25.6 ns) (or the alternative second bit width of seventy (70) bits), and the third bit width of data stream 556 is sixty-five (65) bits (e.g., @25.6 ns).

Figure 5B:
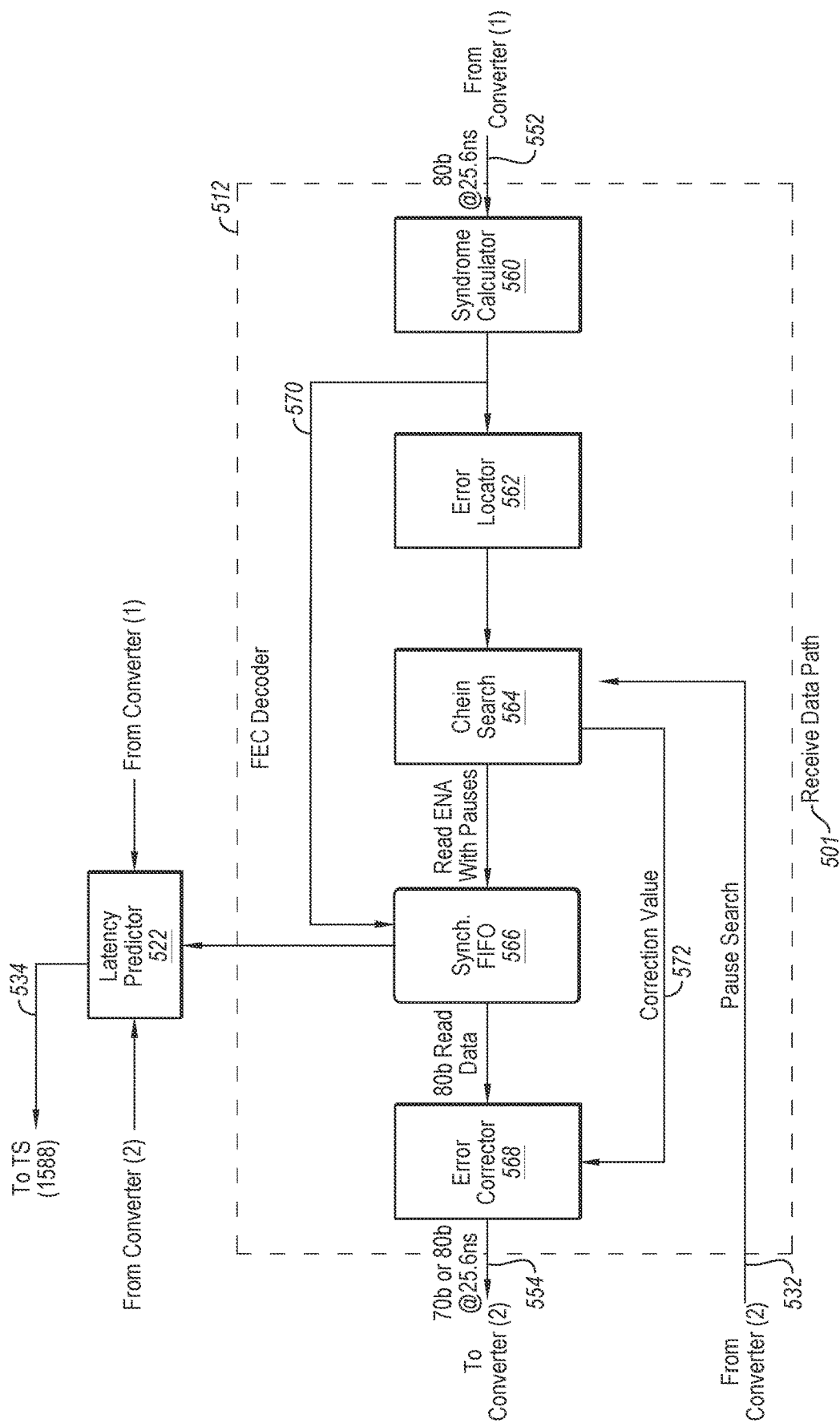
FIG. 5B is a schematic block diagram of a FEC decoder of the receive PHY of FIG. 5A that is known by the inventor of this disclosure.

In FIG. 5B, a schematic block diagram of FEC decoder 512 of FIG. 5A is shown. FEC decoder 512 of FIG. 5B includes a syndrome calculator 560, an error locator 562 (e.g., using an error locator polynomial (ELP) algorithm), a Chein search module 564, a synchronous first-in-first-out (FIFO) 566, and an error corrector 568, arranged as shown. An output of syndrome calculator 560 is provided to an input of error locator 562. In one or more examples, error locator 562 runs for thirty-four (34) clocks (e.g., @25.6 ns). Another output 570 from syndrome calculator 560 is provided to synchronous FIFO 566 for communication of the data stream. Chein search module 564 produces correction values at an output 572 to error corrector 568 for the correction of symbols in the data stream. In one or more examples, Chein search module 564 produces an error location in one (1) clock. Chein search module 564 is to produce read enable signals with pauses to synchronous FIFO 566.

With reference back to FIG. 5A, Ethernet packets may be timestamped by timestamp circuitry 518. Timestamping of the Ethernet packets provides for time synchronization in the network for compliance with IEEE 1588 (e.g., PTP, without limitation). More specifically, timestamp circuitry 518 receives and timestamps Ethernet packets in the data stream 556 (e.g., from PCS decoder 516) having the bit width of sixty-five (65) bits.

Although timestamping is desired, the modules and arrangement of the modules in receiver portion 500A introduce latency in the communication of Ethernet packets. This latency is a variable latency that changes from one packet to the next. For compliance with TSN standards and real-time Ethernet communications, it is desirable to reduce the overall latency of the packets in the PHY. For proper timestamping by timestamp circuitry 518, there should be a guaranteed fixed latency in the PHY, or alternatively, the provision of a predictor logic for calculating the amount of variable latency incurred per packet to properly adjust the timing.

Accordingly, receiver portion 500A includes a latency predictor 522 having an output 534 operably coupled to timestamp circuitry 518 for timing adjustment. However, latency predictor 522 includes complex predictor logic ("1588 predictor logic") to produce, at output 534, a predicted variable latency based on multiple sources of variable latency, as indicated in the figure.

The latency of the frame in receive data path 501 may be determined by the depth of synchronous FIFO 566 (FIG. 5B). In turn, the FIFO depth is determined by the time it takes FEC decoder 512 to correct the frame, which is dominated by the ELP algorithm of error locator 562 (FIG. 5B). The ELP algorithm may execute according to a number of clocks "P" serially (e.g., where P=number of FEC parity symbols). Given the varying FIFO depth, it is difficult to predict the latency when the start of frame (SOF) is written into synchronous FIFO 566. It is also difficult to keep track of the SOF given the different conversions of the gearboxes.

Even further, the area of receive data path 501 is increased due to the flops that are utilized to align the path with the FEC symbol width. The width of synchronous FIFO 566 should be aligned to the FEC symbol width, even though most of the locations in the FIFO do not need such a large width. Syndrome calculator 560 on the FEC symbol width, so flops are used for data accumulation.

Figure 6A:
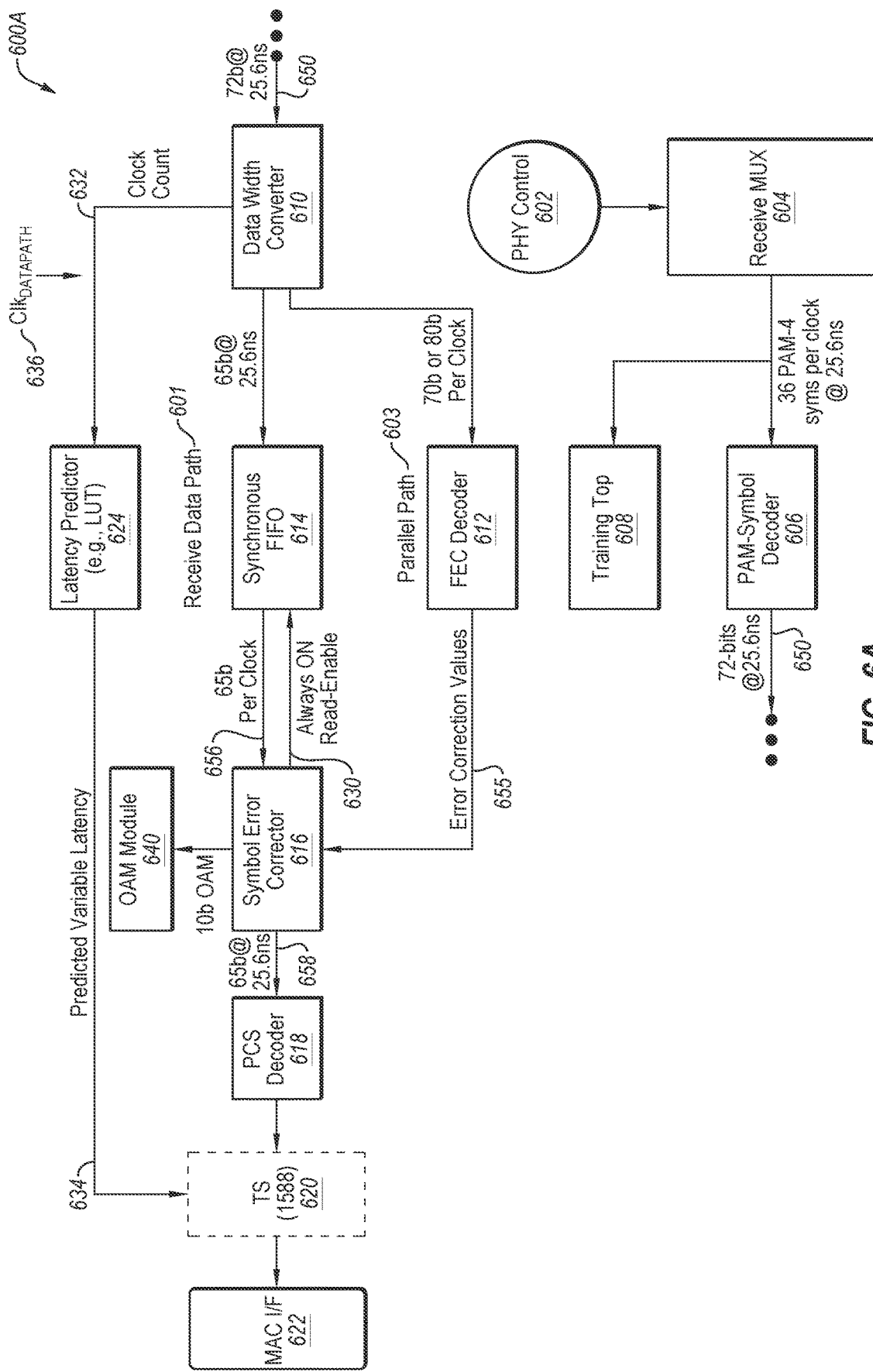
FIG. 6A is a schematic block diagram of a receive PHY of a receiver, according to one or more examples of the disclosure.

FIG. 6A is a schematic block diagram of a receive physical layer (PHY) of a receiver (referred to herein as a receiver portion 600A) according to one or more examples of the disclosure. In one or more examples, receiver portion 600A may be at least part of an Ethernet physical layer transceiver (Ethernet PHY) for receiving data or Ethernet frames. In a specific, non-limiting example, receiver portion 600A is compliant with the IEEE 802.3ch, 2.5GT1 Automotive Ethernet PHY, as described earlier above.

Receiver portion 600A comprises (from right to left in the figure) a receiver MUX 604, a symbol decoder 606, a data width converter 610, a synchronous FIFO 614 (or FIFO, buffer, FIFO buffer, or synchronous FIFO buffer), a symbol error corrector 616, an FEC decoder 612, a PCS decoder 618, timestamp circuit 620, and a MAC I/F 622. A training top module 608 is coupled to receive incoming data stream from receiver MUX 604 for training of scrambling/descrambling. A PHY controller 602 is input to receiver MUX 604 for data or training path selection.

As depicted in FIG. 6A, data width converter 610 is in receive data path 601, and FEC decoder 612 is in parallel with receive data path 601. For example, FEC decoder 612 may be arranged in a parallel path 603 that is in parallel with at least a portion of receive data path 601 and/or synchronous FIFO 614. FEC decoder 612 may operate, at least in substantial part, separately and independently from receive data path 601. Given the arrangement, receive data path 601 provides for a fixed latency in data conveyance.

In one or more examples, receive data path 601 includes (e.g., only) a single data width converter (i.e., data width converter 610). Although "single" in receive data path 601, data width converter 610 may be made of two or more separate data width converter circuits to produce the two respective output data streams (first and second output data streams 652 and 654), or alternatively, utilize shared circuitry to produce the different streams.

More particularly, data width converter 610 includes an input to receive an input data stream 650 having an input bit width, a first output to produce a first output data stream 652 having a first output bit width, and a second output to produce a second output data stream 654 having at least a second output bit width. In one or more examples, the input bit width, the first output bit width, and the at least second output bit width are different from each other.

In one or more examples, synchronous FIFO 614 has an input to which first output data stream 652 having the first bit width is written into synchronous FIFO 614. Synchronous FIFO 614 has an output to which a first output data stream 656 having the first bit width is read out from synchronous FIFO 614. In one or more examples, synchronous FIFO 614 serves as a pipeline stage in receive data path 501. In one or more examples, synchronous FIFO 614 may receive an "always-on" read-enable signal at an output 630 of symbol error corrector 616.

In one or more examples, symbol error corrector 616 includes a first input operably coupled to the output of synchronous FIFO 614, and a second input operably coupled to an error correction output 655 of FEC decoder 612. Symbol error corrector 616 includes an output to produce an error-corrected data stream 658 from first output data stream 656 having the first bit width from synchronous FIFO 614. Error-corrected data stream 658 is produced at least partially based on the one or more error correction values, from error correction output 655, that correct the one or more symbols, the one or more partial symbols, or both, from the first output data stream 656.

FEC decoder 612 includes an input to receive the second output data stream 654 having the at least second output bit width. FEC decoder 612 includes an error correction output 655 to produce one or more error correction values at least partially based on one or more FEC code words in the second output data stream 654. The one or more error correction values are for correction of one or more symbols, one or more partial symbols, or both, in first output data stream 656 having the first bit width from synchronous FIFO 614.

More particularly, in one or more examples, the error correction output of FEC decoder 612 produces the one or more error correction values for respective ones of the one or more FEC code words in the second output data stream 654, for correction of respective ones of the one or more symbols, the one or more partial symbols, or both, in the first output data stream 652 having the first bit width.

In one or more examples, receiver portion 600A of the PHY transceiver is configured in accordance with IEEE 802.3ch 2.5GT1. For compliance with 2.5GT1, the symbol width is ten (10) bits, the input bit width of input data stream 650 is seventy-two (72) bits (e.g., @25.6 ns), the first output bit width of first output data stream 652 (e.g., to synchronous FIFO 614) is sixty-five (65) bits (e.g., @25.6 ns), and the second output bit width of second output data stream 654 (e.g., to FEC decoder 612) is seventy (70) or eighty (80) bits (e.g., @25.6 ns). Each IEEE 802.3ch FEC frame runs for fifty (50) clocks.

In one or more examples, FEC decoder 612 is operative on k symbols (e.g., received over multiple clock cycles) in the second output data stream 654 having the at least second bit width. Respective ones of the k symbols comprise a symbol width of s bits. In one or more examples, the at least second output bit width is an integer multiple of the symbol width of s bits (e.g., ten (10) bits).

In one or more examples, FEC decoder 612 is an RS-FEC decoder. In one or more examples, FEC decoder 612 decodes based on an RS code of RS(360,326). In one or more examples, an RS code may be represented by RS(n, k), where n=the total number of symbols in the FEC code word, k=the number of data symbols for data, and (n−k)=the number of parity symbols for parity.

In one or more other examples, receiver portion 600A is configured in accordance with one or more different standards, bit rates, bit widths, speeds, and/or codes.

In one or more examples, symbol decoder 606 includes an output operably coupled to the input of data width converter 610. The output of symbol decoder 606 produces the first input data stream 650 having the first bit width to data width converter 610. In one or more examples, PCS decoder 618 includes an input to receive the error-corrected data stream having the first output bit width.

Figure 6B:
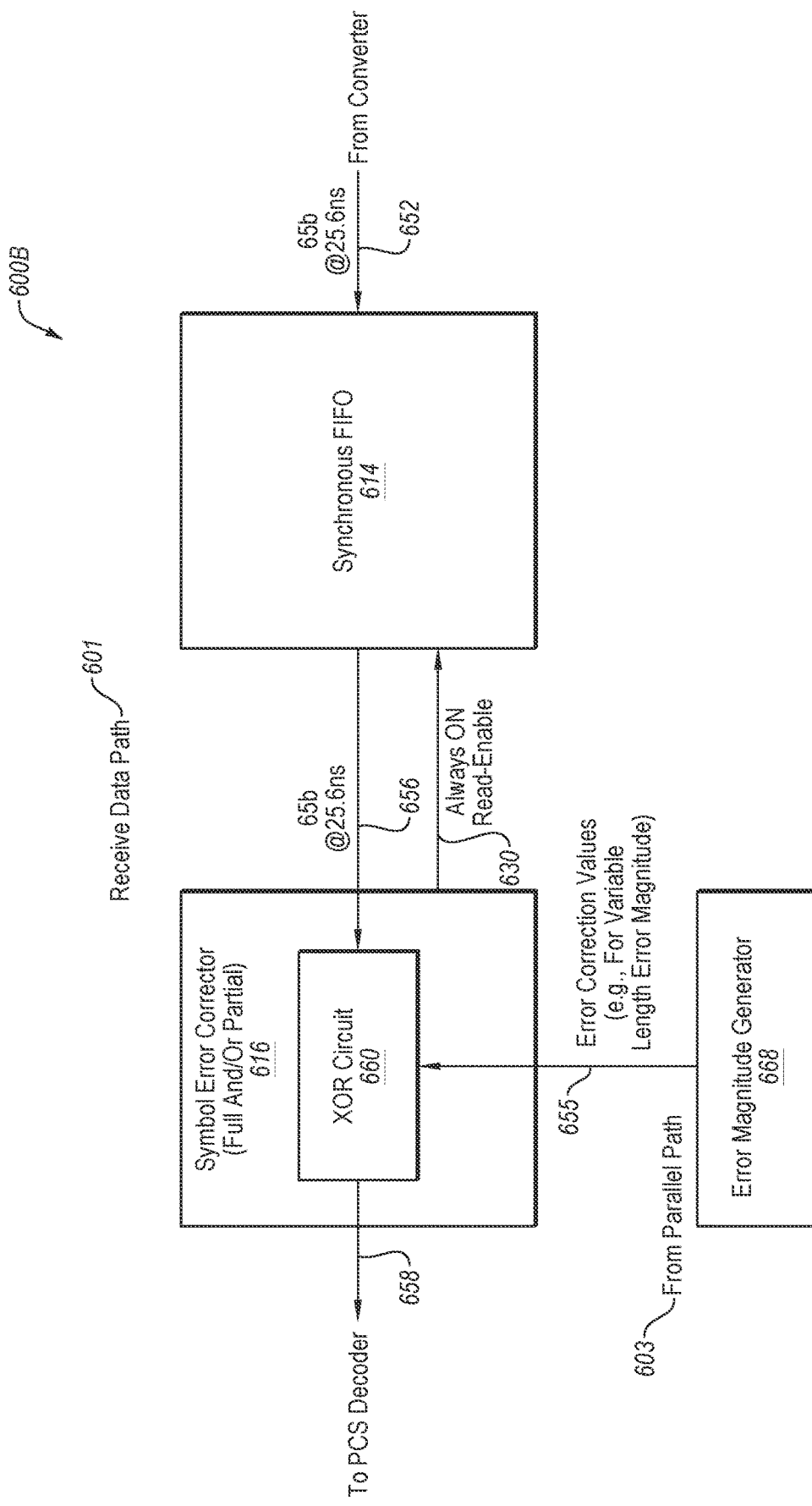
FIG. 6B is a block diagram of a circuit portion in the receive PHY of FIG. 6A, according to one or more examples.

In FIG. 6B, a block diagram of a circuit portion 600B in receive data path 601 of FIG. 6A is shown, where the circuit portion 600B includes synchronous FIFO 614 and symbol error corrector 616.

Figure 6C:
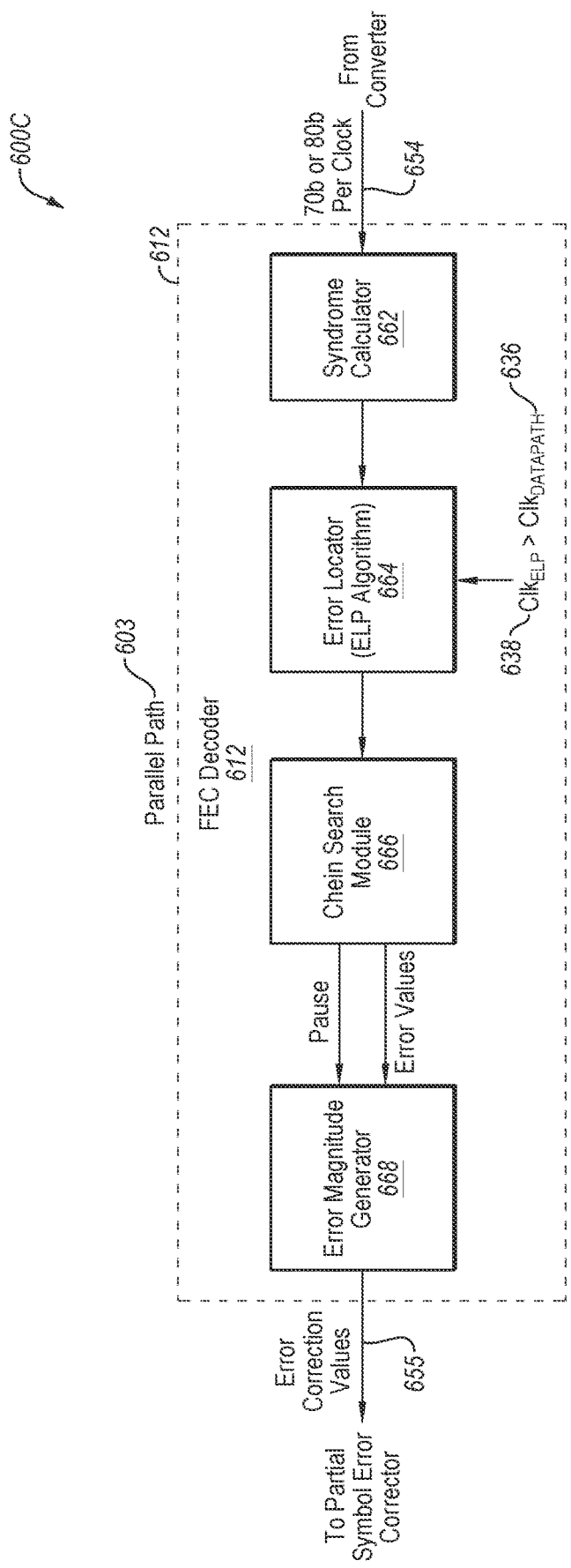
FIG. 6C is a block diagram of a FEC decoder of FIG. 6A, according to one or more examples.

In FIG. 6C, a block diagram 600C of FEC decoder 612 of FIG. 6A in parallel path 603 is shown, where FEC decoder 612 includes a syndrome calculator 662, error locator 664 (e.g., using an ELP algorithm), a Chein search module 666, and an error magnitude generator 668, arranged as shown.

The at least second output bit width of second output data stream 654 (FIGS. 6A and 6C) may be an integer multiple of the symbol width for FEC decoding. On the other hand, the first output bit width of first output data stream 652 (FIGS. 6A and 6B) may not be an integer multiple of the symbol width.

In one or more examples of the disclosure, symbol error corrector 616 (FIGS. 6A and 6B) is configured as partial symbol error corrector, and error magnitude generator 668 (FIGS. 6B and 6C) is configured as a variable length error magnitude generator (not merely a fixed symbol width error magnitude generator).

With reference to FIG. 6B, symbol error corrector 616 may receive the one or more error correction values at error correction output 655 for correction of the one or more symbols, the one or more partial symbols, or both, in first output data stream 656 from synchronous FIFO 614. The output of symbol error corrector 616 produces error-corrected data stream 658 from first output data stream 656 at least partially based on the one or more error correction values.

As symbol error corrector 616 may correct both full symbols and partial symbols, symbol error corrector 616 may be and/or be referred to as a partial symbol error corrector. In one or more examples, a symbol width of a full symbol is ten (10) bits. In one or more examples, a partial symbol width of a partial symbol is five (5) bits. In one or more examples, symbol error corrector 616 corrects both full symbols of ten (10) bits and partial symbols of five (5) bits as needed.

In one or more examples, an error magnitude generator 668 of the FEC decoder in parallel path 603 produces a variable length error magnitude for error correction at symbol error corrector 616. In one or more examples, error magnitude generator 668 selectively outputs error correction values according to whether a full or partial symbol correction is desired or needed. More particularly, error magnitude generator 668 may selectively output, at error correction output 655, a selected number of the one or more error correction values (e.g., one or more error magnitude values) for correction of the respective full or partial symbol.

In one or more examples, symbol error corrector 616 includes an XOR circuit 660 for XORing the full/partial symbols in first output data stream 656 with the error correction values.

Symbol error corrector 616 may also produce the always-on read-enable signal at output 630 to synchronous FIFO 614. In one or more examples, the always-on read enable signal may allow regular or continuous operation of synchronous FIFO 614 during decoding operations. Compare, for example, synchronous FIFO 566 of FIG. 5B that receives read enable signals with pauses from Chein search module 564. Accordingly, synchronous FIFO 614 of FIG. 6A-6B may serve as a pipeline stage in receive data path 601.

With reference to FIG. 6C, in one or more examples, error magnitude generator 668 may pause the FEC decoding logic (e.g., Chein search module 666), regularly or periodically, as desired or needed. As error magnitude generator 668 is in parallel path 603, no variable latency would be incurred by the pausing.

Continuing with FIG. 6C, syndrome calculator 662 has an input to receive second output data stream 654 having the at least second output bit width, and an output to produce one or more syndromes at least partially based on the one or more FEC code words in the second output data stream 654. Error locator 664 is operably coupled to the output of syndrome calculator 662, being provided to an input of error locator 562. In one or more examples, Chein search module 666 provides error location values to error magnitude generator 668. In one or more examples, syndrome calculator 560 may operate for fifty (50) clocks to produce a syndrome; error locator 664 may run for seventeen (17) clocks (e.g., @25.6 ns); and Chein search module 666 provides seven (7) error location values in one (1) clock.

In one or more examples, syndrome calculator 662 is operative on k symbols of the second output data stream 654 having the at least second bit width. Respective ones of the k symbols comprise a symbol width of s bits (e.g., ten (10) bits). In one or more examples, the at least second output bit width is an integer multiple of the symbol width.

In one or more examples, syndrome calculator 662 may be or be referred to as a variable-symbol syndrome calculator. In one or more examples, the second output data stream 654 having the at least second output bit width has a second output bit width in one or more first data transfers, and a third output bit width in one or more second data transfers. In one or more examples, syndrome calculator 662 is operative on a variable number of received symbols, including at the second output bit width where k=7 and at the third output bit width where k=8. In one or more examples, comparing the present approach with the traditional approach of running the syndrome calculator on fixed eight (8) symbols, the buffer savings is from three-hundred-sixty (360) bits to eight (8) bits. A specific, non-limiting example of such a syndrome calculator is shown and described later in relation to FIG. 10.

As described earlier, error locator 664 may operate according to an ELP algorithm. In one or more examples, the ELP algorithm is provided to perform control channel adjustments according to rIBM (Reformulated Inversionless Berlekamp Massey algorithm). Note that the ELP algorithm is a relatively independent process as it does not depend on the incoming receive data rate. In addition, the ELP algorithm is not a time critical function, but merely needs to run serially for P-clocks to obtain the polynomial (P=number of parity symbols). To begin processing, the ELP algorithm needs only to obtain a P-symbol syndrome. In one or more examples, for 2.5GT1, P=thirty-four (34) symbols. A specific, non-limiting example of an ELP algorithm of error locator 664 is shown and described later in relation to FIG. 11.

According to one or more examples, the ELP algorithm of error locator 664 is executed at a relatively higher speed clock speed than that of the receive data path. Here, with respect to FIG. 6A, data width converter 610 is in receive data path 601, and at least most of receive data path 601 is responsive to a first clock signal 636 ($CLK_{DATAPATH}$) having a first clock frequency. As indicated in FIG. 6C, error locator 664 utilizing the ELP algorithm may be responsive to a second clock signal 638 ($CLK_{ELP}$) having a second clock frequency. In one or more examples, the second clock frequency of second clock signal 638 ($CLK_{ELP}$) is greater than the first clock frequency of first clock signal 636 ($CLK_{DATAPATH}$).

In one or more examples, the ELP algorithm may run at a clock having a speed that is two (2) times the speed of the receive data path. In one or more examples (e.g., for 2.5GT1), the receive data path may operate at a clock @25.6 ns, whereas the ELP algorithm may execute at a clock @12.8 ns (e.g., two (2) times the speed of the receive data path). Here, the residence time of every FEC frame is reduced from eighty-four (84) clocks to sixty-seventy (67) clocks. In one or more other examples, a different ratio or percentage between clocks (i.e., $CLK_{ELP}$ and $CLK_{DATAPATH}$) is utilized.

In one or more examples, latency predictor 624 is operably coupled to data width converter 610, and timestamp circuit 620 is operably coupled to latency predictor 624. In one or more examples, latency predictor 624 selects a latency value responsive to a clock count value provided at an output 632 of data width converter 610. In one or more examples, latency predictor 624 comprises a look-up table (LUT) of latency values respectively associated with clock count values. Timestamp circuit 620 is in receive data path 601 to timestamp the error corrected data stream. Timestamp circuit 620 receives a latency value at an output 634 of latency predictor 624 and adjusts a timing of timestamp circuit 620 at least partially based on the latency value. In one or more examples, the SOF is relatively easy to predict with use of a look-up table.

In one or more examples relating to latency savings, the residence time of the frame in the receive data path may be reduced from eighty-four (84) clocks to sixty-seven (67) clocks. Thus, the latency may be reduced to 435.2 ns per FEC frame. Due to running a clock at a speed two (2) times the speed of the receive data path, seventeen (17) clock savings may be achieved.

In one or more examples relating to area savings, the FIFO size in the FEC decoder in the traditional approach may have a size of 81×45=3645; whereas the FIFO size in the present approach may be 65×50=3250. By introducing the syndrome calculator, the buffers used in the gearboxes may also be reduced in size (e.g., from 360-bits to 8-bits).

With reference back to FIG. 6A, receiver portion 600A may include an Operations, Administrations, and Maintenance (OAM) module 640. In general, OAM data may be regularly or periodically inserted in the data stream, in what may be referred to as an in-band data exchange. For 2.5GT1, an OAM symbol of ten (10) bits is included at a fixed position in every FEC frame (e.g., at the 326t h symbol). Here, received OAM data may be analyzed for monitoring link operation, such as PHY link health status or other.

In one or more examples, OAM module 640 may be coupled to symbol error corrector 616 and/or the output of FEC decoder 612. In one or more examples, OAM data is processed via parallel path 603 separately from the processing in receive data path 601. For example, data width converter 610 may set up an OAM channel in parallel path 603, so that OAM data is passed through parallel path 603 and not through synchronous FIFO 614 of receive data path 601. The one or more correction values of error magnitude generator 668 may be applied directly to the last symbol for correction of the OAM data.

FIG. 7A is a flowchart depicting a process 700 to process receive data in a receive data path including parallel FEC decoding, according to one of more examples.

In one or more examples, process 700 may include converting an input data stream having an input bit width to a first output data stream having a first output bit width and to a second output data stream having at least a second output bit width, in an act 702. In one or more examples, the input bit width, the first output bit width, and the at least second output bit width are different from each other. In one or more examples, act 702 may include multiple acts of conversion.

In one or more examples, process 700 may include performing FEC decoding process on one or more FEC code words of the second output data stream having the at least second output bit width, for producing one or more error correction values, in an act 704.

In one or more examples, process 700 may include correcting one or more symbols, one or more partial symbols, or both, in the first output data stream having the first output bit width at least partially based on the one or more error correction values, in an act 706.

In one or more examples, converting (e.g., in act 702) the input data stream having the input bit width to the first output data stream having the first output bit width is performed in a receive data path, and performing (e.g., in act 704) the FEC decoding process involves performing at least part of the FEC decoding process in parallel with the receive data path. In one or more examples, the receive data path provides a fixed latency in communication of the first output data stream.

In one or more examples, the first output data stream having the first bit width is written into a synchronous FIFO in the receive data path, and the first output data stream having the first bit width read out from the synchronous FIFO.

In one or more examples, performing (e.g., in act 704) the at least part of the FEC decoding process comprises performing on k symbols in the second output data stream having the at least second bit width, where respective ones of the k symbols comprise a symbol width of ten (10) bits. In one or more examples, correcting (e.g., in act 706) the one or more symbols, the one or more partial symbols, or both, comprises correcting the one or more partial symbols. In one or more examples, correcting the one or more partial symbols involves correcting the one or more partial symbols having a partial symbol width of five (5) bits.

In one or more examples, performing (e.g., in act 704) the at least part of the FEC decoding process comprises generating one or more error magnitude values comprising the one or more error correction values. In one or more examples, generating the one or more error magnitude values comprises selectively providing a selected number of the one or more error magnitude values comprising the one or more error correction values.

In one or more examples, performing (e.g., in act 704) the at least part of the FEC decoding process comprises calculating one or more syndromes at least partially based on the one or more FEC code words in the second output data stream having the at least second bit width. In one or more examples, respective ones of k symbols in the second output data stream comprise a symbol width of ten (10) bits. In one or more examples, process 300 may include calculating the one or more syndromes with respect to k symbols of the second output data stream, wherein k=7, and calculating the one or more syndromes with respect to k symbols of the second output data stream, wherein k=8.

In one or more examples, process 700 may include signaling a latency predictor with a clock count value, where the latency predictor comprises a look-up table of latency values respectively associated with clock count values. In one or more examples, process 300 may include adjusting a timing of a timestamping process for timestamping at least partially based on a latency value received from the latency predictor, the latency value being responsive to the clock count value.

Figure 7B:
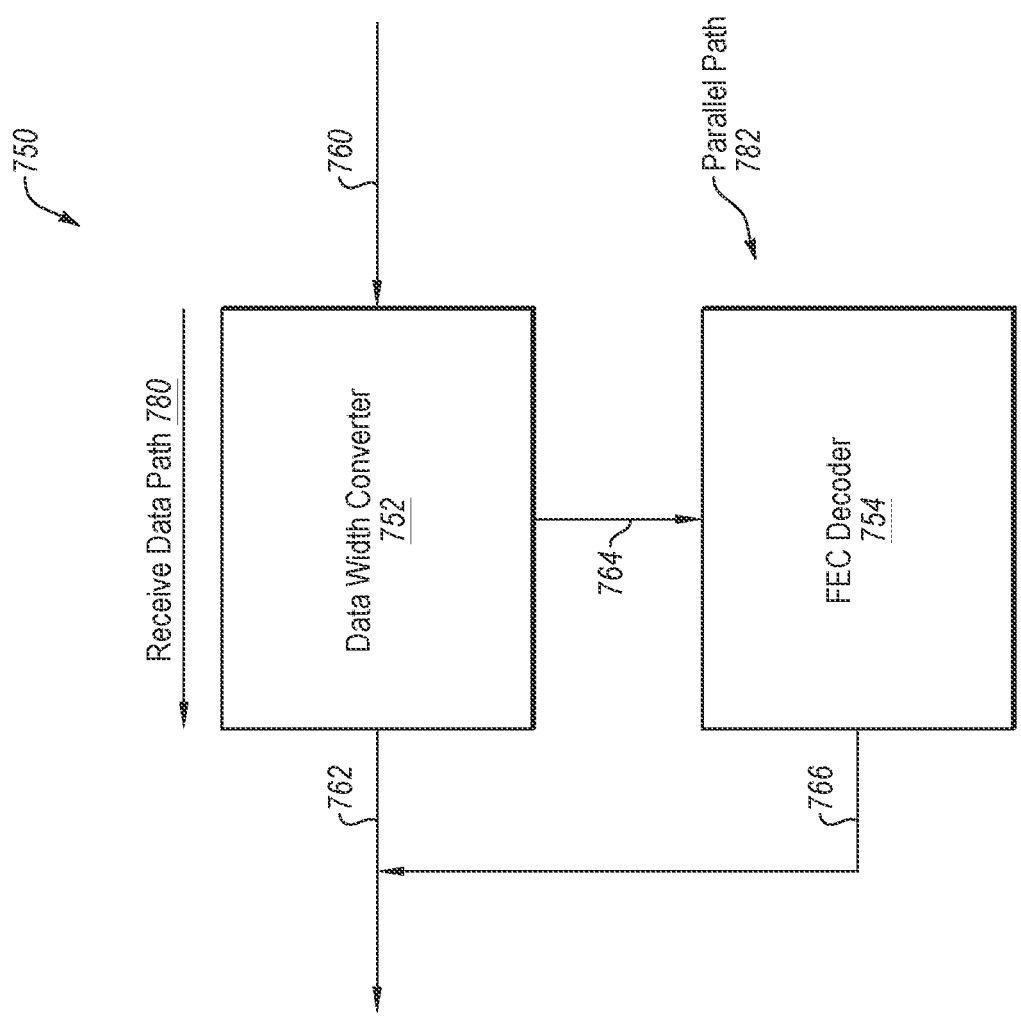
FIG. 7B is an apparatus to process receive data in a receive data path including parallel FEC decoding, according to one or more examples.

FIG. 7B is an apparatus 750 to process receive data in a receive data path including parallel FEC decoding, according to one or more examples. In one or more examples, apparatus 750 includes a data width converter 752 and an FEC decoder 754. In one or more examples, data width converter 752 is in a receive data path 780, and at least a portion of FEC decoder 754 is in parallel with receive data path 780 (e.g., in a parallel path 782).

Data width converter 752 includes an input to receive an input data stream 760 having an input bit width, a first output to produce a first output data stream 762 having a first output bit width, and a second output to produce a second output data stream 764 having at least a second output bit width. FEC decoder 754 includes an input to receive the second output data stream 764 having the at least second output bit width. FEC decoder 754 includes an error correction output 766 to produce one or more error correction values at least partially based on one or more FEC code words in the second output data stream 764. The one or more error correction values are for correction of one or more symbols, one or more partial symbols, or both, in the first output data stream 762 having the first output bit width.

With reference to the specific, non-limiting example of FIG. 8, a table 800 of numbers of transferred data bits per clock cycle associated with operation of data width converter 610 of FIG. 6A is shown. In FIG. 8, the clock count indicates a current, relative clock count that is relative to a repeating cycle of clock counts, for example, a repeating cycle of 1 to 50 clock counts, or other clock count range. Here, the numbers of transferred data bits per clock cycle include the numbers of transferred data bits from the data width converter to the synchronous FIFO ("converter-to-FIFO"), and the numbers of transferred data bits from the data width converter to the FEC decoder/syndrome calculator ("converter-to-syndrome-calculator"). The converter-to-FIFO column in table 800 is associated with first output data stream 652 having the first output bit width (FIG. 6A) (e.g., sixty-five (65) bits); and the converter-to-syndrome-calculator column in table 800 is associated with second output data stream 654 having the second output bit width (FIG. 6A) (e.g., seventy (70) bits or seven (7) symbols; or eighty (80) bits or eight (8) symbols).

As indicated in the example of FIG. 8, the syndrome calculator of the FEC decoder receives seven (7) symbols at a symbol width of ten (10) bits per clock cycle, for a total of seventy (70) bits per clock cycle. This occurs for respective ones of four (4) consecutive clock cycles. Then, the syndrome calculator receives eight (8) symbols at a symbol width of ten (10) bits for the next (single) clock cycle, for a total of eighty (80) bits for the clock cycle. This process then repeats with the syndrome calculator again receiving seventy (70) bits per clock cycle for four (4) consecutive clock cycles and then receiving eighty (80) bits for the next clock cycle, and so on. The syndrome calculator may output one or more syndromes when a full FEC code word is received and processed.

FIG. 9 is a look-up table (LUT) 900 for a latency predictor associated with a receiver portion of a receive PHY, according to one or more examples. LUT 900 is a look-up table of latency values respectively associated with clock count values. In one or more examples, the latency values in LUT 900 are fixed or predetermined latency values that depend upon the clock count. The clock count to be input is a current, relative clock count that is relative to a repeating cycle of clock counts, for example, a repeating cycle of 1 to 50 clock counts, or other clock count range.

Data width converter (or other component or mechanism) signals the latency predictor having LUT 900 with a (current, relative) clock count. In response, LUT 900 outputs a selected latency value that corresponds to the clock count. A timestamp circuit receives the selected latency value from LUT 900 and adjusts its timing at least partially based on the selected latency value.

Note that an LUT for a transmitter portion of a transmit PHY may be substantially the same as LUT 900 of FIG. 9, according to one or more examples. In one or more examples, the latency predictor utilized in the transmit/receive PHY may solely be a look-up table (without any additional circuitry or substantial additional circuitry).

One or more examples relate, generally, to determining variable latency, and reducing complexity as compared to the traditional approaches discussed above. In one or more examples, there is a fixed delay introduced by the modules in the transmit data path (e.g., by modules other than the data width converter). The variable latency introduced by the data width converter may therefore be reduced to a simple LUT, so the latency can be easily determined or selected at least partially based on a current, running clock count in the data width converter.

To better illustrate by example, a data width converter may maintain an internal clock count from 1 to 50 (e.g., each IEEE 802.3ch FEC frame runs for fifty (50) clocks). Also, a pipeline depth between the data width converter and the PCS decoder may exist, for example, as sixty-nine (69) clocks. When an SOF is received in the PCS decoder, the internal clock count of the data width converter may indicate the $n^{th}$ clock. Inside the data width converter, the clock count is (c=n−69) clocks when it gave out the SOF. Based on this relationship (c=n−69), one can determine the variable delay introduced by data width converter, which is sixty-nine (69) clocks before current clock count. Accordingly, a predictor LUT that outputs a variable latency value may be based on the (c=n−69) relationship.

Figure 10:
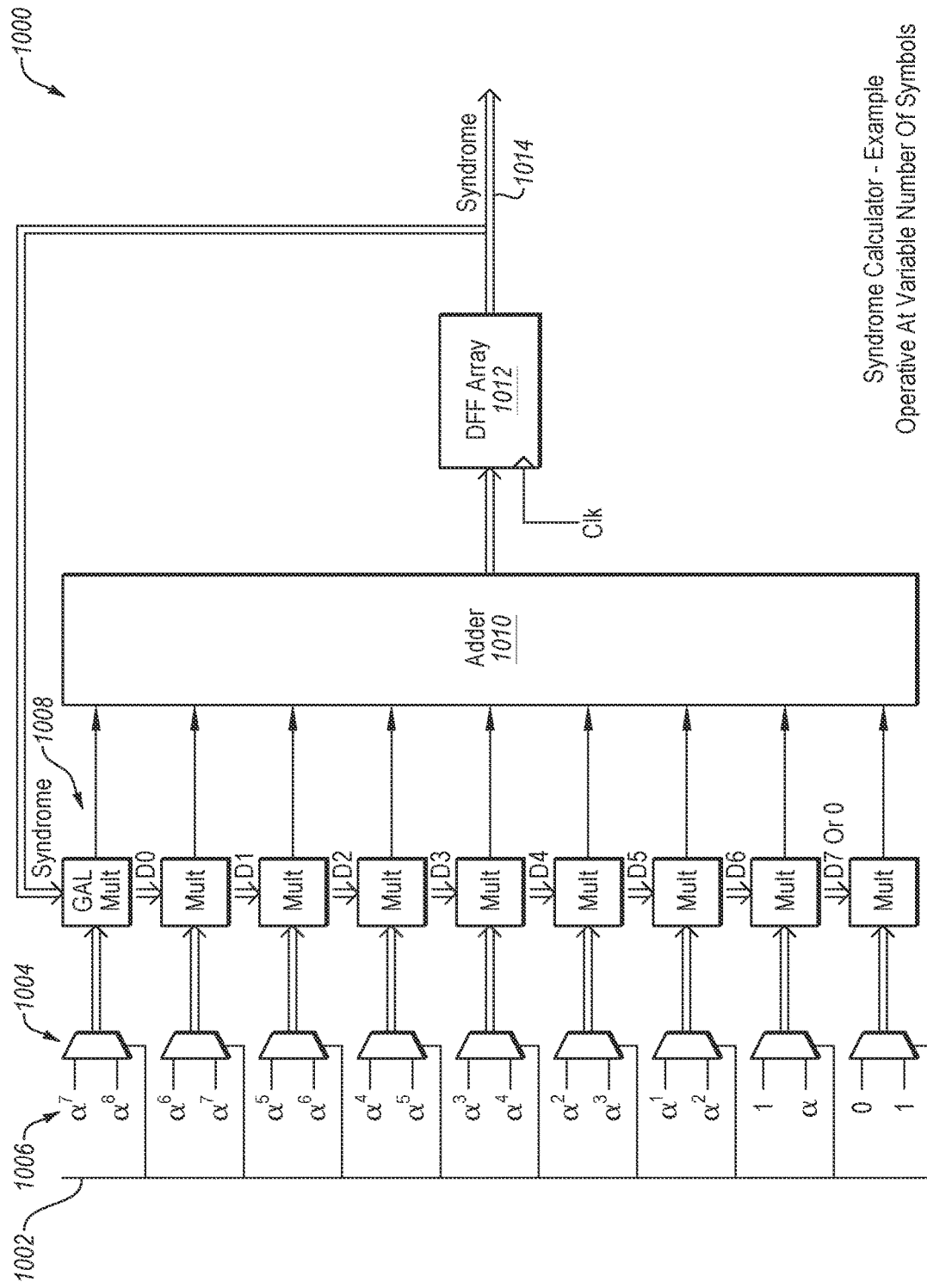
FIG. 10 is a syndrome calculator associated with the FEC decoder of the receive PHY of FIGS. 6A-6C, according to one or more examples.

FIG. 10 is a syndrome calculator 1000 for a FEC decoder of a receive PHY, according to one or more examples. In one or more examples, syndrome calculator 1000 of FIG. 10 may be utilized as syndrome calculator 662 of FEC decoder 612 indicated in FIG. 6C.

In one or more examples, syndrome calculator 1000 may be or be referred to as a variable-symbol syndrome calculator. In the example shown, syndrome calculator 1000 may include a plurality of input selectors 1004 having a plurality of inputs 1006 (alpha exponents), a plurality of multipliers 1008 for performing multiplication in relation to the selected inputs, an adder 1010, and a shift register (DFF) array 1012, arranged as shown. Syndrome calculator 1000 may produce a syndrome at an output 1014. As indicated, syndrome calculator 1000 utilizes alpha-exponents to calculate the syndrome and these alpha-exponents are manipulated (e.g., per clock), as indicated in the figure. A selector input 1002 is employed (e.g., an incoming bit) to select between the number of symbols to be processed (e.g., syndrome calculator 1000 manipulates the alpha exponents at least partially based on the incoming bit or selection).

Figure 11:
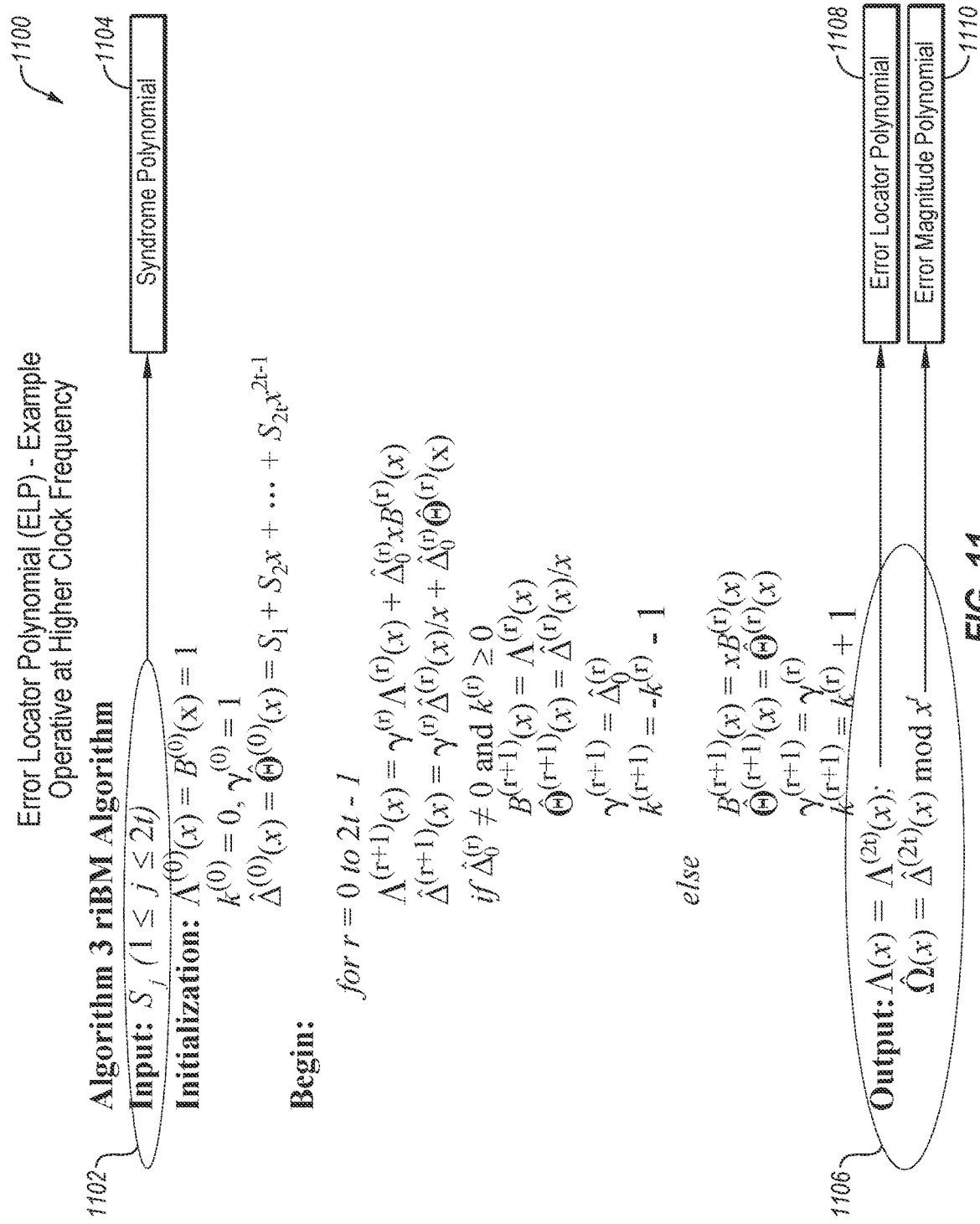
FIG. 11 is an example of an error locator polynomial (ELP) algorithm of an error locator associated with the FEC decoder of the receive PHY, according to one or more examples.

FIG. 11 is an example of an error locator polynomial (ELP) algorithm 1100 of an error locator for an FEC decoder of a receive PHY, according to one or more examples. In one or more examples, such an ELP algorithm may be utilized in error locator 664 of FEC decoder 612 of FIG. 6C. The ELP algorithm 1100 shown in FIG. 11 is one of many different standard algorithms and/or approaches (conventional or otherwise) that may be utilized in an FEC decoder. As shown in FIG. 11, ELP algorithm 1100 may include an input function 1102 associated with a syndrome polynomial 1104 and output functions 1106 respectively associated with an error locator polynomial 1108 and an error magnitude polynomial 1110. While specific parameters are indicated in FIG. 11, these parameters are not intended to be limiting and will depend on the specific application and/or operating conditions.

In one or more examples, ELP algorithm 1100 may execute at a higher clock rate (e.g., a clock rate associated with clock signal $CLK_{ELP}$) than the clock rate of the receive data path (e.g., a clock rate associated with clock signal $CLK_{DATAPATH}$). For example, the receive data path may be responsive to a first clock signal (e.g., clock signal $CLK_{DATAPATH}$) having a first clock frequency, whereas the error locator having ELP algorithm 1100 may be responsive to a second clock signal (e.g., clock signal $CLK_{ELP}$) having a second clock frequency, the second clock frequency being greater than the first clock frequency.

Figure 12:
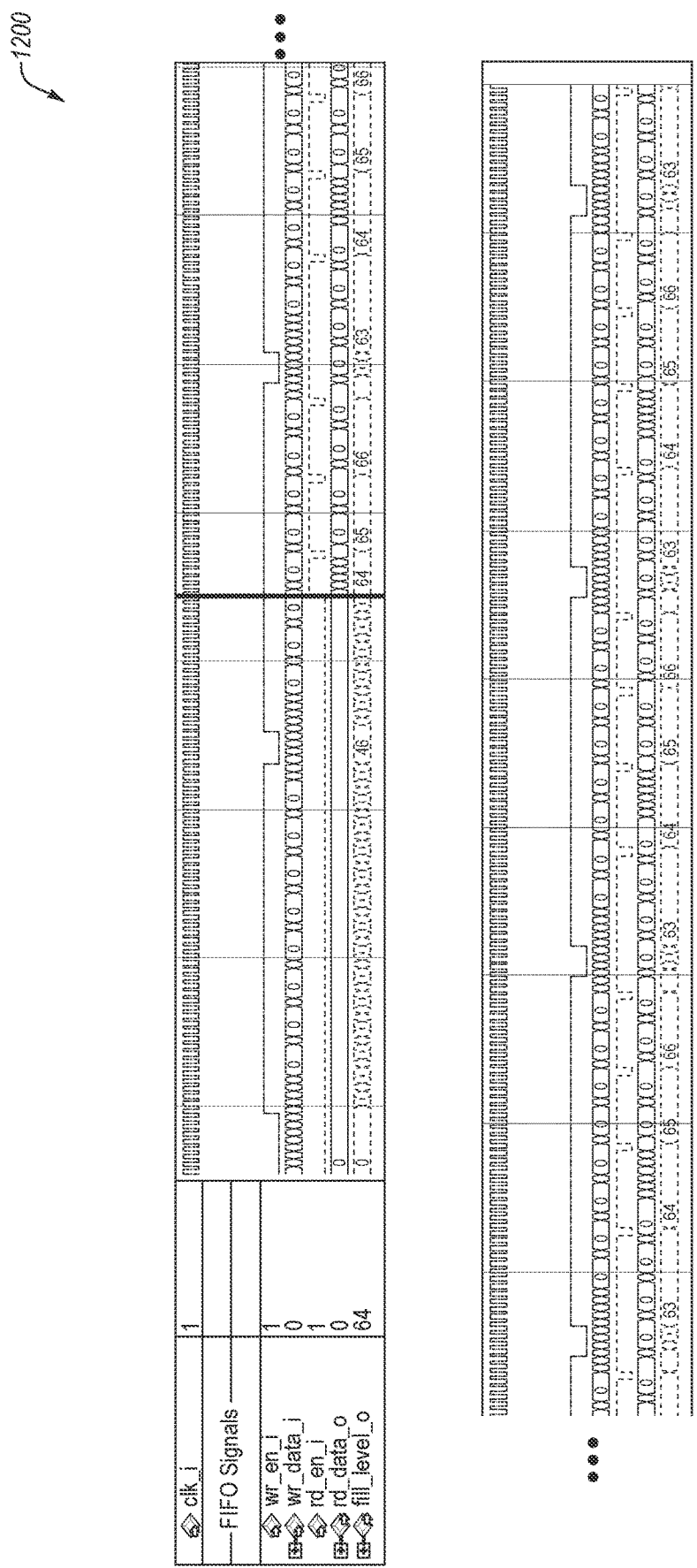
FIG. 12 is a timing diagram of communication processing associated with the receive data path having an integrated FEC decoding approach.

FIG. 12 is a timing diagram 1200 of communication processing associated with the receive data path having the integrated FEC decoding approach (see, e.g., FIGS. 5A and 5B). Timing diagram 1200 reveals variable fill levels that occur as a result of necessary pausing. The varying fill levels result in use of a complex predictor logic for predicting latency.

Figure 13:
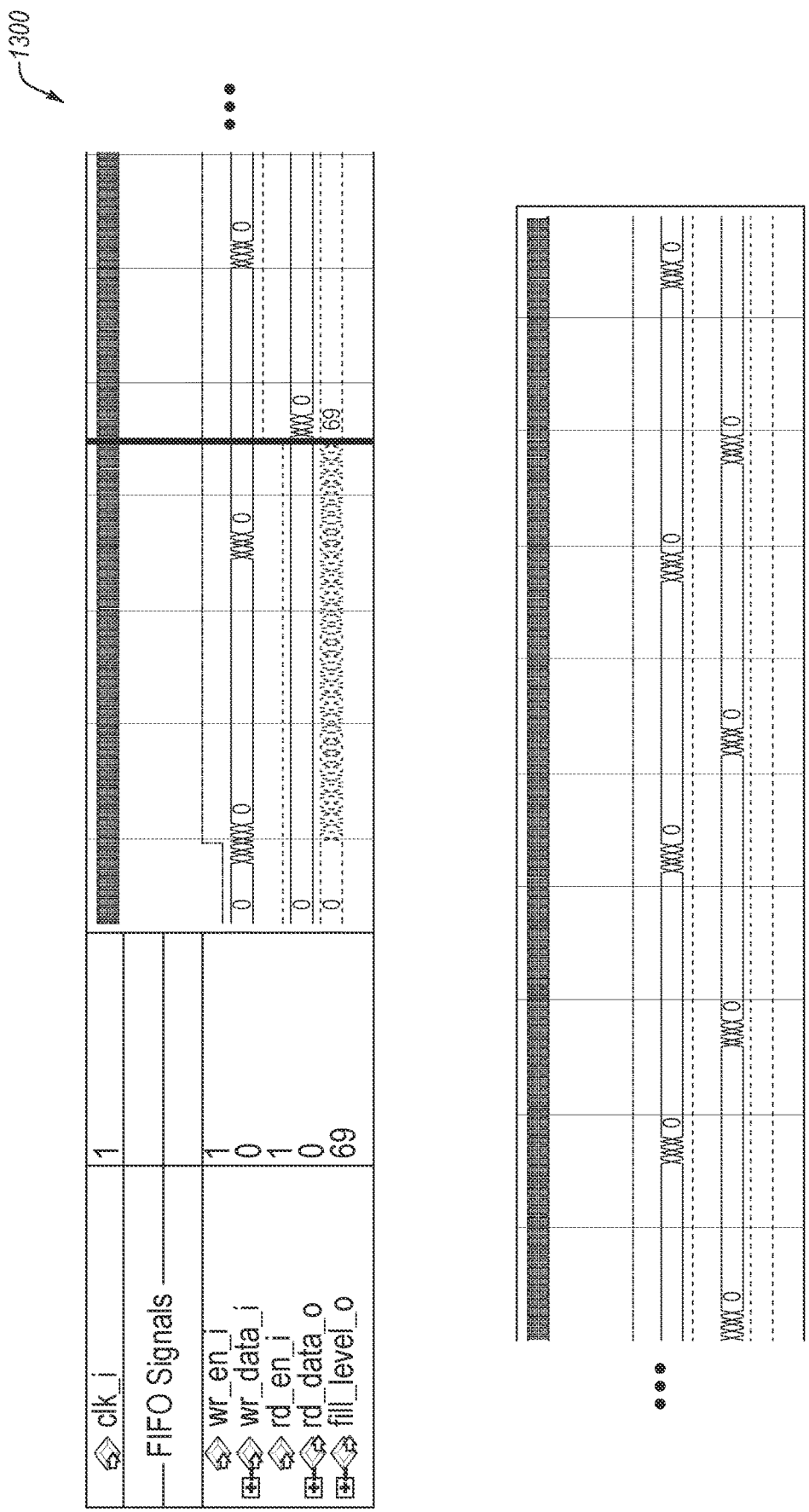
FIG. 13 is a timing diagram of communication processing associated with the receive data path having a parallel FEC decoding approach.

FIG. 13 is a timing diagram 1300 of communication processing associated with the receive data path having the parallel FEC decoding approach (see, e.g., FIGS. 6A-6C). Compare FIG. 13 with previous FIG. 12. Timing diagram 1300 reveals fixed FIFO fill levels that occur as a result of no pausing.

Figure 14A:
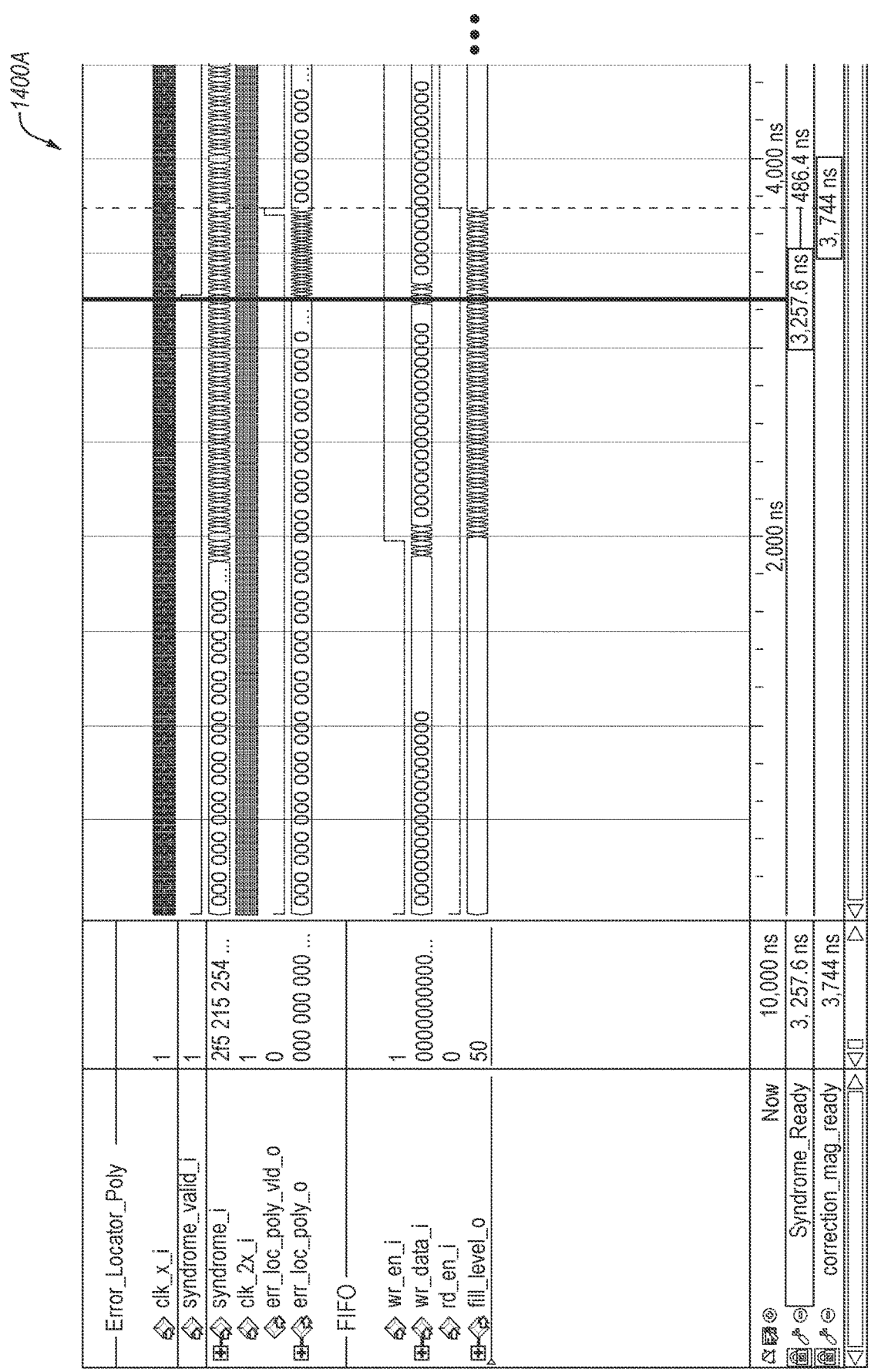
FIGS. 14A and 14B are timing diagram portions of a timing diagram of communication processing associated with usage of a first clock rate for the receive data path and a second clock rate (i.e., a higher clock rate) for the ELP algorithm.
Figure 14B:
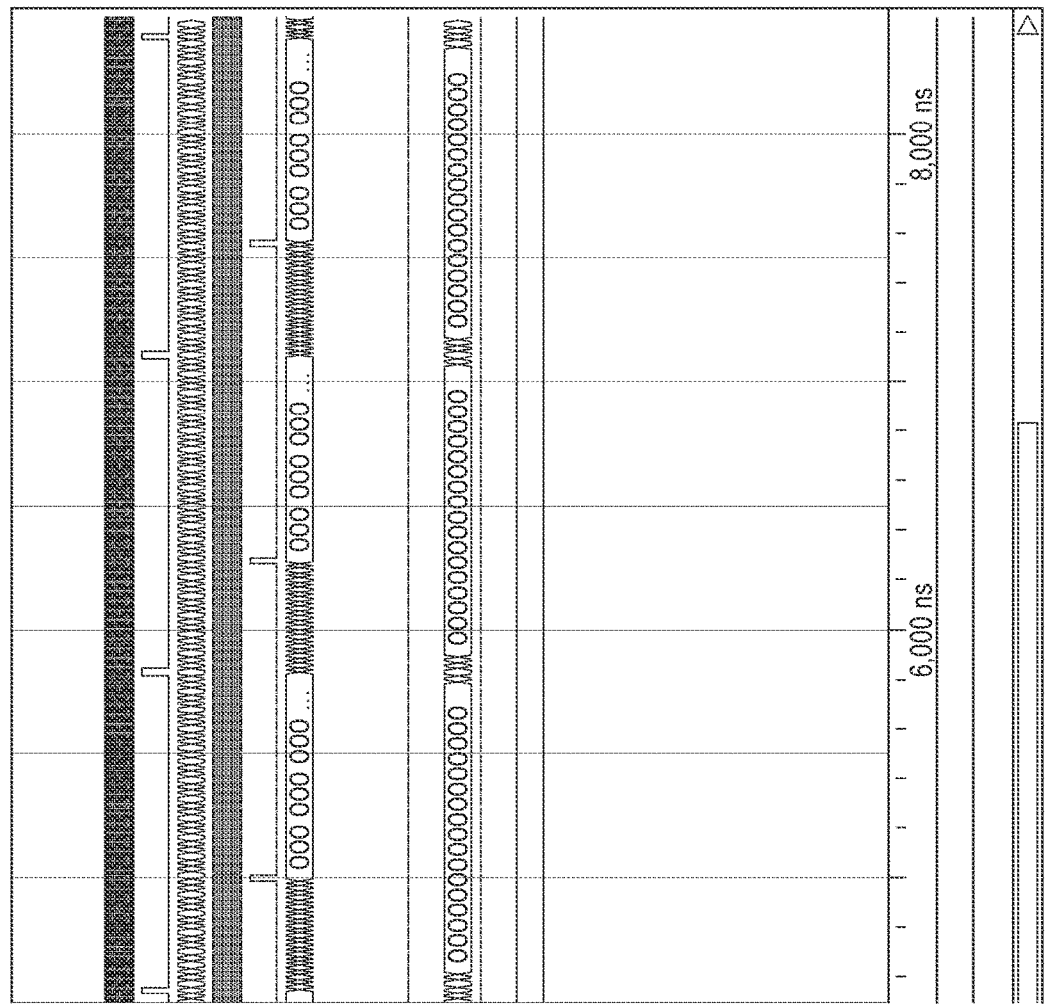

FIGS. 14A and 14B are timing diagram portions 1400A and 1400B of a timing diagram of communication processing associated with usage of a first clock rate for the receive data path and a second clock rate (i.e., a higher clock rate) for the ELP algorithm (see, e.g., FIGS. 6A-6C and 11). As described previously, the ELP algorithm may run at a clock having a speed that is two (2) times the speed (@12.8 ns) of the speed of the receive data path (@25.6 ns). From the time that the syndrome is available to the time that the ELP is provided is 486.4 ns (486.4/25.6 ns=only 19 clocks). The FIFO fill level and the write/read enables are fixed. From the previous figure (FIG. 13), the maximum FIFO fill level was 66 (@81 bits). In FIGS. 14A and 14B, the maximum FIFO fill level is 69 (@65 bits).

Figure 15A:
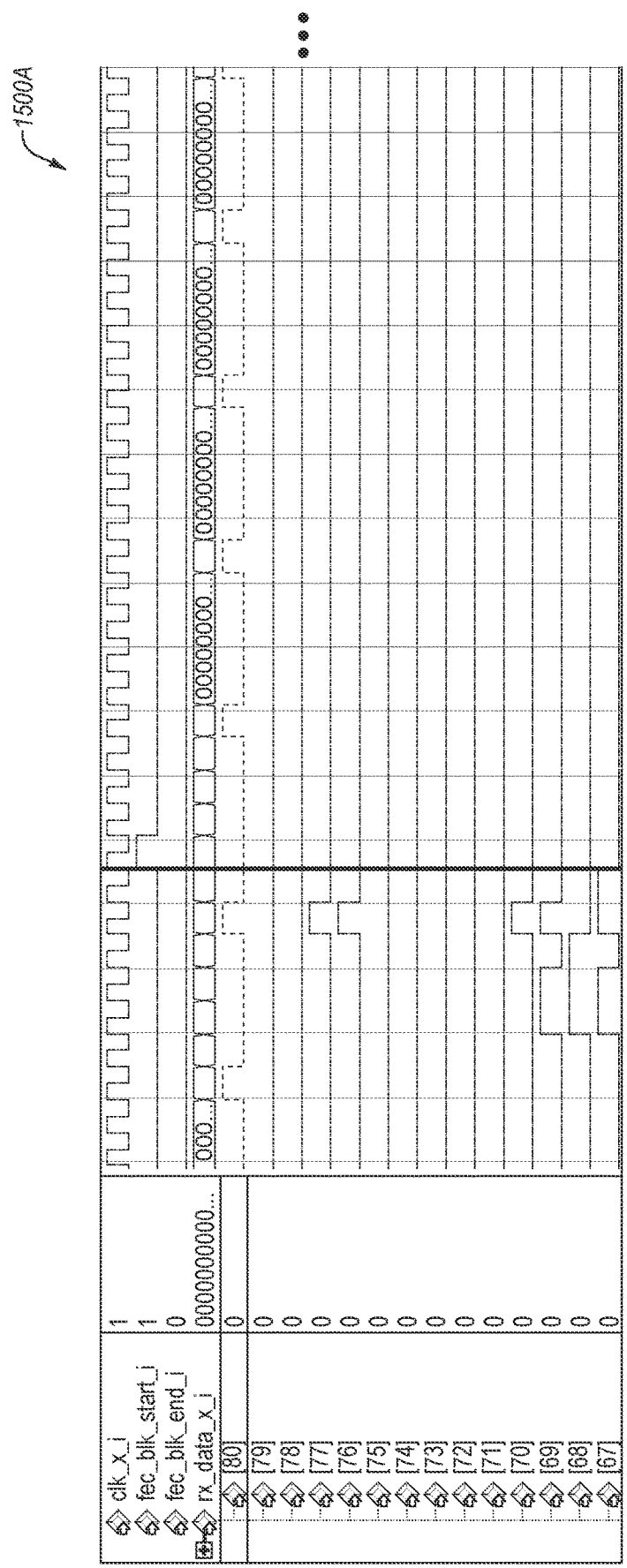
FIGS. 15A and 15B are timing diagram portions of a timing diagram of communication processing associated with the variable symbol syndrome calculation.
Figure 15B:
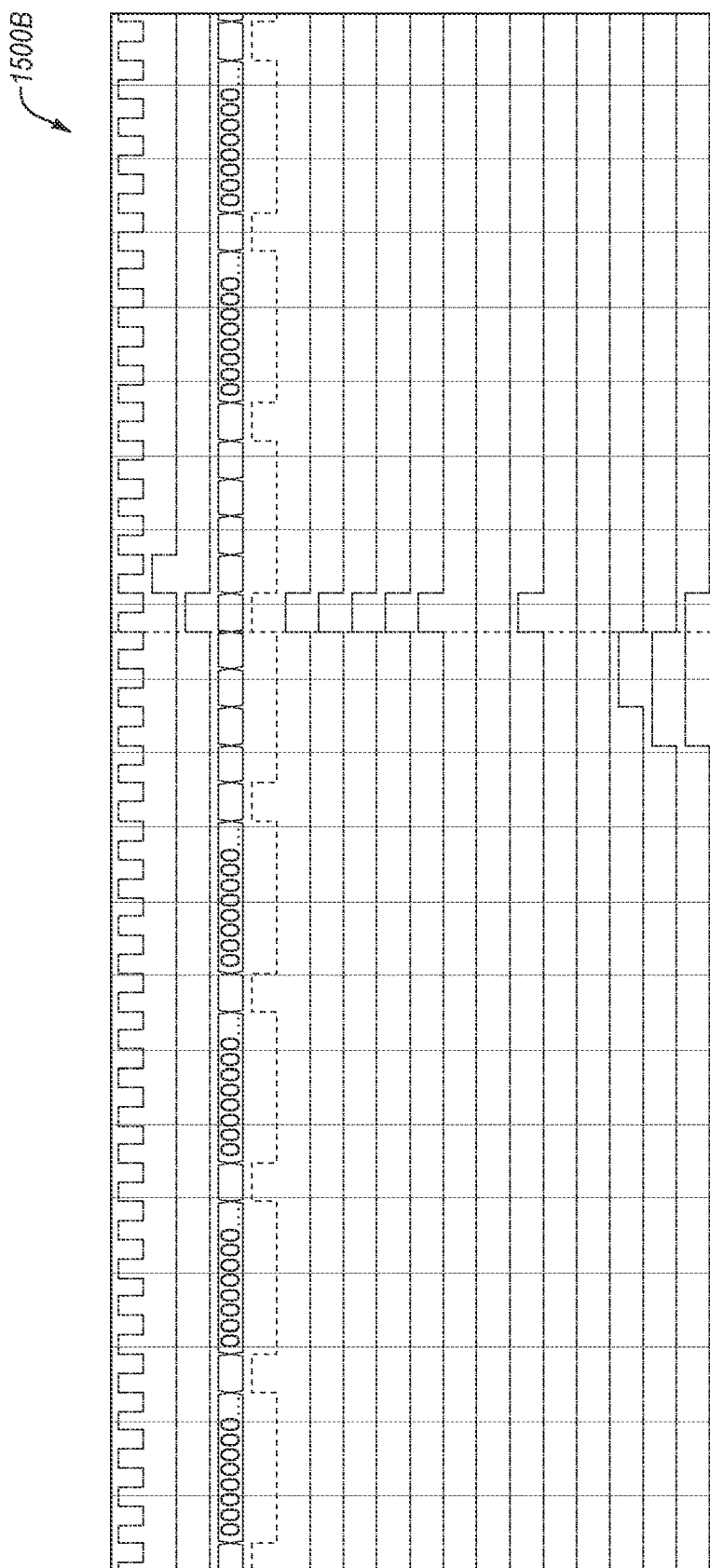

FIGS. 15A and 15B are timing diagram portions 1500A and 1500B of a timing diagram of communication processing associated with the variable symbol syndrome calculation (see, e.g., FIGS. 6A-6C and 10). The two (2) cursors indicate the boundaries of an FEC frame. "rx_data_x_i" marks the incoming data to the syndrome calculator. "Bit-80" indicates whether the valid input data is eighty (80) bits or seventy (70) bits. The syndrome calculator manipulates the alpha exponents based on this incoming bit, "Bit-80."

FIG. 16 is a block diagram of circuitry 1600 that, in some examples, may be used to implement various functions, operations, acts, processes, and/or methods disclosed herein. The circuitry 1600 includes one or more processors 1604 (sometimes referred to herein as "processors 1604") operably coupled to one or more data storage devices (sometimes referred to herein as "storage 1606"). The storage 1606 includes machine-executable code 1608 stored thereon and the processors 1604 include a logic circuit 1610. The machine-executable code 1608 includes information describing functional elements that may be implemented by (e.g., performed by) the logic circuit 1610. The logic circuit 1610 is adapted to implement (e.g., perform) the functional elements described by the machine-executable code 1608. The circuitry 1600, when executing the functional elements described by the machine-executable code 1608, should be considered as special purpose hardware for carrying out functional elements disclosed herein. In some examples, the processors 1604 may perform the functional elements described by the machine-executable code 1608 sequentially, concurrently (e.g., on one or more different hardware platforms), or in one or more parallel process streams.

When implemented by logic circuit 1610 of the processors 1604, the machine-executable code 1608 adapts the processors 1604 to perform operations of examples disclosed herein. For example, the machine-executable code 1608 may be to adapt the processors 1604 to perform at least a portion or a totality of the method of FIG. 3A and/or the method of FIG. 7A. As another example, the machine-executable code 1608 may be to adapt the processors 1604 to perform at least a portion or a totality of the operations described in relation to transmitter portion 200 of FIG. 2 and apparatus 350 of FIG. 3B, and/or receiver portion 600A of FIG. 6A and apparatus 750 of FIG. 7B.

The processors 1604 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes functional elements corresponding to the machine-executable code 1608 (e.g., software code, firmware code, hardware descriptions) related to examples of the present disclosure. It is noted that a general-purpose processor (may also be referred to herein as a host processor or simply a host) may be a microprocessor, but in the alternative, the processors 1604 may include any conventional processor, controller, microcontroller, or state machine. The processors 1604 may also be implemented as a combination of computing devices, such as a combination of a DSP and a microprocessor, a plurality of microprocessors, one or more microprocessors in conjunction with a DSP core, or any other such configuration.

In some examples the storage 1606 includes volatile data storage (e.g., random-access memory (RAM)), non-volatile data storage (e.g., Flash memory, a hard disc drive, a solid state drive, erasable programmable read-only memory (EPROM), etc.). In some examples the processors 1604 and the storage 1606 may be implemented into a single device (e.g., a semiconductor device product, a system on chip (SOC), etc.). In some examples the processors 1604 and the storage 1606 may be implemented into separate devices.

In some examples the machine-executable code 1608 may include computer-readable instructions (e.g., software code, firmware code). By way of non-limiting example, the computer-readable instructions may be stored by the storage 1606, accessed directly by the processors 1604, and executed by the processors 1604 using at least the logic circuit 1610. Also by way of non-limiting example, the computer-readable instructions may be stored on the storage 1606, transferred to a memory device (not shown) for execution, and executed by the processors 1604 using at least the logic circuit 1610. Accordingly, in some examples the logic circuit 1610 includes electrically configurable logic circuit 1610.

In some examples the machine-executable code 1608 may describe hardware (e.g., circuitry) to be implemented in the logic circuit 1610 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 1610 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine-executable code 1608 may include an HDL, an RTL, a GL description, a mask level description, other hardware description, or any combination thereof.

In examples where the machine-executable code 1608 includes a hardware description (at any level of abstraction), a system (not shown, but including the storage 1606) may be to implement the hardware description described by the machine-executable code 1608. By way of non-limiting example, the processors 1604 may include a programmable logic device (e.g., an FPGA or a PLC) and the logic circuit 1610 may be electrically controlled to implement circuitry corresponding to the hardware description into the logic circuit 1610. Also by way of non-limiting example, the logic circuit 1610 may include hard-wired logic manufactured by a manufacturing system (not shown, but including the storage 1606) according to the hardware description of the machine-executable code 1608.

Regardless of whether the machine-executable code 1608 includes computer-readable instructions or a hardware description, the logic circuit 1610 is adapted to perform the functional elements described by the machine-executable code 1608 when implementing the functional elements of the machine-executable code 1608. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, etc.) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc.," or "one or more of A, B, and C, etc.," is used, in general such a construction is intended to include A alone, B alone, C alone, A and B together, A and C together, B and C together, or A, B, and C together, etc.

Any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

ADDITIONAL NON-LIMITING EXAMPLES OF THE DISCLOSURE INCLUDE

Example 1: An apparatus comprising: a data width converter, the data width converter including an input to receive an input data stream having an input bit width, a first output to produce a first output data stream having a first output bit width, and a second output to produce a second output data stream having at least a second output bit width; and a forward error correction (FEC) decoder, the FEC decoder including an input to receive the second output data stream having the at least second output bit width, the FEC decoder including an error correction output to produce one or more error correction values at least partially based on one or more FEC code words in the second output data stream, the one or more error correction values for correction of one or more symbols, one or more partial symbols, or both, in the first output data stream having the first output bit width.

Example 2: The apparatus according to Example 1, wherein: the data width converter is in a receive data path, and at least a portion of the FEC decoder is in parallel with the receive data path.

Example 3: The apparatus according to Examples 1 and 2, wherein the received data path provides a fixed latency in communication of the first output data stream.

Example 4: The apparatus according to any of Examples 1 to 3, wherein the input bit width, the first output bit width, and the at least second output bit width are different from each other.

Example 5: The apparatus according to any of Examples 1 to 4, comprising: a synchronous first-in-first-out (FIFO), the synchronous FIFO having an input to which the first output data stream having the first bit width is written into the synchronous FIFO, the synchronous FIFO having an output to which the first output data stream having the first bit width is read out from the synchronous FIFO.

Example 6: The apparatus according to any of Examples 1 to 5, wherein the FEC decoder comprises: a symbol error corrector, the symbol error corrector having a first input operably coupled to the output of the synchronous FIFO, a second input operably coupled to the error correction output of the FEC decoder, and an output to produce an error-corrected data stream from the first output data stream having the first bit width at least partially based on the one or more error correction values that correct the one or more symbols, the one or more partial symbols, or both.

Example 7: The apparatus according to any of Examples 1 to 6, wherein the FEC decoder is operative on k symbols in the second output data stream having the at least second output bit width, respective ones of the k symbols comprise a symbol width of s bits, and the symbol width is ten (10) bits, and wherein: the output of the symbol error corrector to produce the error-corrected data stream at least partially based on the one or more error correction values that correct the one or more partial symbols having a partial symbol width of five (5) bits.

Example 8: The apparatus according to any of Examples 1 to 7, wherein the FEC decoder comprises: an error magnitude generator, the error magnitude generator to selectively output, at the error correction output, a selected number of the one or more error correction values for correction of the one or more symbols, the one or more partial symbols, or both, the one or more correction values comprising one or more error magnitude values.

Example 9: The apparatus according to any of Examples 1 to 8, wherein the FEC decoder comprises: a syndrome calculator, the syndrome calculator having an input to receive the second output data stream having the at least second output bit width and an output to produce one or more syndromes at least partially based on the one or more FEC code words in the second output data stream.

Example 10: The apparatus according to any of Examples 1 to 9, wherein the syndrome calculator is operative on k symbols of the second output data stream having the at least second bit width, respective ones of the k symbols comprise a symbol width of ten (10) bits, and the at least second output bit width is an integer multiple of the symbol width of s bits.

Example 11: The apparatus according to any of Examples 1 to 10, wherein the second output data stream having the at least second output bit width has a second output bit width in one or more first data transfers and a third output bit width in one or more second data transfers, and wherein: the syndrome calculator is operative on a variable number of symbols, including at the second output bit width where k=7 and at the third output bit width where k=8.

Example 12: The apparatus according to any of Examples 1 to 11, wherein the data width converter is in a receive data path and the receive data path is responsive to a first clock signal having a first clock frequency, the apparatus comprising: an error locator polynomial generator, the error locator polynomial generator responsive to a second clock signal having a second clock frequency, the second clock frequency greater than the first clock frequency.

Example 13: The apparatus according to any of Examples 1 to 12, wherein: the symbol error corrector includes another output to produce an always-on read enable signal to the synchronous FIFO.

Example 14: The apparatus according to any of Examples 1 to 13, comprising: a latency predictor, the latency predictor operably coupled to the data width converter, the latency predictor comprising a look up table of latency values respectively associated with clock count values.

Example 15: The apparatus according to any of Examples 1 to 14, comprising: a timestamp circuit to timestamp the error corrected data stream, the timestamp circuit to receive a latency value from the latency predictor and to adjust a timing of the timestamp circuit at least partially based on the latency value.

Example 16: The apparatus according to any of Examples 1 to 15, wherein: the error correction output of the FEC decoder to produce the one or more error correction values for respective ones of the one or more FEC code words in the second output data stream for correction of respective ones of the one or more symbols, the one or more partial symbols, or both, in the first output data stream having the first bit width.

Example 17: The apparatus according to any of Examples 1 to 16, wherein: the FEC decoder is operative on k symbols in the second output data stream having at least the second bit width, respective ones of the k symbols comprise a symbol width of s bits, and the at least second output bit width is an integer multiple of the symbol width of s bits.

Example 18: The apparatus according to any of Examples 1 to 17, wherein: the symbol width is ten (10) bits, and the at least second output bit width is seventy (70) bits or eighty (80) bits.

Example 19: The apparatus according to any of Examples 1 to 18, wherein: the input bit width is seventy-two (72) bits, and the first output bit width is sixty-five (65) bits.

Example 20: A method comprising: converting an input data stream having an input bit width to a first output data stream having a first output bit width and to a second output data stream having at least a second output bit width; performing a forward error correction (FEC) decoding process on one or more FEC code words of the second output data stream having the at least second output bit width, for producing one or more error correction values; and correcting one or more symbols, one or more partial symbols, or both, in the first output data stream having the first output bit width at least partially based on the one or more error correction values.

Example 21: The method according to Example 20, wherein: converting the input data stream having the input bit width to the first output data stream having the first output bit width is performed in a receive data path, and performing the FEC decoding process comprises performing at least part of the FEC decoding process in parallel with the receive data path.

Example 22: The method according to Examples 20 and 21, wherein the receive data path provides a fixed latency in communication of the first output data stream.

Example 23: The method according to any of Examples 20 to 22, wherein the input bit width, the first output bit width, and the second output bit width are different from each other.

Example 24: The method according to any of Examples 20 to 23, comprising: writing into a synchronous first-in-first-out (FIFO) the first output data stream having the first bit width; and reading out from the synchronous FIFO the first output data stream having the first bit width.

Example 25: The method according to any of Examples 20 to 24, wherein correcting the one or more symbols, the one or more partial symbols, or both, comprises correcting the one or more partial symbols.

Example 26: The method according to any of Examples 20 to 25, wherein: performing the at least part of the FEC decoding process comprises performing on k symbols in the second output data stream having the at least second output bit width, wherein respective ones of the k symbols comprise a symbol width of ten (10) bits, and correcting the one or more partial symbols comprises correcting the one or more partial symbols having a partial symbol width of five (5) bits.

Example 27: The method according to any of Examples 20 to 26, wherein performing the at least part of the FEC decoding process comprises: generating one or more error magnitude values comprising the one or more error correction values.

Example 28: The method according to any of Examples 20 to 27, wherein generating comprises: selectively providing a selected number of the one or more error magnitude values comprising the one or more error correction values.

Example 29: The method according to any of Examples 20 to 28, wherein performing the at least part of the FEC decoding process comprises: calculating one or more syndromes at least partially based on the one or more FEC code words in the second output data stream having the at least second bit width.

Example 30: The method according to any of Examples 20 to 29, wherein respective ones of k symbols in the second output data stream comprise a symbol width of ten (10) bits, the method comprising: calculating the one or more syndromes with respect to k symbols of the second output data stream, wherein k=7, and calculating the one or more syndromes with respect to k symbols of the second output data stream, wherein k=8.

Example 31: The method according to any of Examples 20 to 30, comprising: signaling a latency predictor with a clock count value, the latency predictor comprising a look up table of latency values respectively associated with clock count values.

Example 32: The method according to any of Examples 20 to 31, comprising: adjusting a timing of a timestamping process for timestamping at least partially based on a latency value received from the latency predictor, the latency value responsive to the clock count value.

Example 33: An apparatus comprising: a data width converter in a receive data path, the data width converter including an input to receive an input data stream having an input bit width, a first output to produce a first output data stream having a first output bit width, and a second output to produce a second output data stream having at least a second output bit width; a synchronous first-in-first-out (FIFO) in the receive data path, the synchronous FIFO having an input to which the first output data stream having the first bit width is written into the synchronous FIFO, the synchronous FIFO having an output to which the first output data stream having the first bit width is read out from the synchronous FIFO; at least a portion of a forward error correction (FEC) decoder in parallel with the receive data path, the at least portion of the FEC decoder including an input to receive the second output data stream having the at least second output bit width, the at least portion of the FEC decoder including an error correction output to produce one or more error correction values at least partially based on one or more FEC code words in the second output data stream having the at least second output bit width; and a symbol error corrector in the receive data path, the symbol error corrector having a first input operably coupled to the output of the synchronous FIFO, a second input operably coupled to the error correction output of the FEC decoder, and an output to produce an error-corrected data stream from the first output data stream having the first bit width at least partially based on the one or more error correction values that correct one or more symbols, one or more partial symbols, or both, in the first output data stream.

Example 34: The apparatus according to Example 33, wherein: the at least portion of the FEC decoder is operative on k symbols in the second output data stream having the at least second bit width, and respective ones of the k symbols comprise a symbol width of ten (10) bits, and the output of the symbol error corrector to produce the error-corrected data stream at least partially based on the one or more error correction values for correction of the one or more partial symbols having a partial symbol width of five (5) bits.

Example 35: The apparatus according to Examples 33 and 34, wherein the at least portion of the FEC decoder comprises: an error magnitude generator, the error magnitude generator to selectively output, at the error correction output, a selected number of the one or more correction values for correction of the one or more symbols or the one or more partial symbols, the one or more correction values comprising one or more error magnitude values.

Example 36: The apparatus according to any of Examples 33 to 35, wherein the at least portion of the FEC decoder comprises: a syndrome calculator, the syndrome calculator having an input to receive the second output data stream having the at least second output bit width and an output to produce one or more syndromes at least partially based on the one or more FEC code words.

Example 37: The apparatus according to any of Examples 33 to 36, wherein the syndrome calculator is operative on k symbols of the second output data stream having the at least second bit width, respective ones of the k symbols comprise a symbol width of s bits, and the at least second output bit width is an integer multiple of the symbol width.

Example 38: The apparatus according to any of Examples 33 to 37, wherein the syndrome calculator is operative at a variable number of symbols.

Example 39: The apparatus according to any of Examples 33 to 38, wherein the second output data stream having the at least second output bit width has a second output bit width in one or more first data transfers and a third output bit width in one or more second data transfers, the symbol width is ten (10) bits, and wherein: the syndrome calculator is operative at the variable number of symbols including at the second output bit width where k=7 and at the third output bit width where k=8.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus comprising:
   a data width converter in a receive data path, the data width converter including an input to receive an input data stream having an input bit width, a first output to produce a first output data stream having a first output bit width, and a second output to produce a second output data stream having a second output bit width;
   a forward error correction (FEC) decoder, at least a portion of the FEC decoder in parallel with the receive data path, the FEC decoder including an input to receive the second output data stream having the second output bit width, the FEC decoder including an error correction output to produce one or more error correction values at least partially based on one or more FEC code words in the second output data stream, the one or more error correction values for correction of one or more symbols, one or more partial symbols, or both, in the first output data stream having the first output bit width; and
   a latency predictor, the latency predictor operably coupled to the data width converter, the latency predictor comprising a look up table of latency values respectively associated with clock count values.

2. The apparatus of claim 1, wherein:
   the data width converter is to provide a clock count value to the latency predictor, and
   the latency predictor is to select a latency value at least partially responsive to the clock count value, the latency value for adjustment of timing used for timestamping data stream communications in the receive data path.

3. The apparatus of claim 2, wherein the received data path provides a fixed latency in communication of the first output data stream.

4. The apparatus of claim 1, wherein the input bit width, the first output bit width, and the second output bit width are different from each other.

5. The apparatus of claim 1, comprising:
   a synchronous first-in-first-out (FIFO), the synchronous FIFO having an input to which the first output data stream having the first bit width is written into the synchronous FIFO, the synchronous FIFO having an output to which the first output data stream having the first bit width is read out from the synchronous FIFO.

6. The apparatus of claim 5, wherein the FEC decoder comprises:
a symbol error corrector, the symbol error corrector having a first input operably coupled to the output of the synchronous FIFO, a second input operably coupled to the error correction output of the FEC decoder, and an output to produce an error-corrected data stream from the first output data stream having the first bit width at least partially based on the one or more error correction values that correct the one or more symbols, the one or more partial symbols, or both.

7. The apparatus of claim 6, wherein the FEC decoder is operative on k symbols in the second output data stream having the second output bit width, k is a positive integer, and respective ones of the k symbols comprise a symbol width of ten (10) bits, and wherein:
the output of the symbol error corrector to produce the error-corrected data stream at least partially based on the one or more error correction values that correct the one or more partial symbols having a partial symbol width of five (5) bits.

8. The apparatus of claim 7, wherein the FEC decoder comprises:
an error magnitude generator, the error magnitude generator to selectively output, at the error correction output, a selected number of the one or more error correction values for correction of the one or more symbols, the one or more partial symbols, or both, the one or more correction values comprising one or more error magnitude values.

9. The apparatus of claim 1, wherein the FEC decoder comprises:
a syndrome calculator, the syndrome calculator having an input to receive the second output data stream having the second output bit width and an output to produce one or more syndromes at least partially based on the one or more FEC code words in the second output data stream.

10. The apparatus of claim 9, wherein the syndrome calculator is operative on k symbols of the second output data stream having the second output bit width, respective ones of the k symbols comprise a symbol width of ten (10) bits, k is a positive integer, and the second output bit width is an integer multiple of the symbol width of ten (10) bits.

11. The apparatus of claim 10, wherein the second output data stream has the second output bit width in one or more first data transfers and a third output bit width in one or more second data transfers, and wherein:
the syndrome calculator is operative on a variable number of symbols, including at the second output bit width where k=7 and at the third output bit width where k=8.

12. The apparatus of claim 9, wherein the data width converter is in a receive data path and the receive data path is responsive to a first clock signal having a first clock frequency, the apparatus comprising:
an error locator polynomial generator, the error locator polynomial generator responsive to a second clock signal having a second clock frequency, the second clock frequency greater than the first clock frequency.

13. The apparatus of claim 6, wherein:
the symbol error corrector includes another output to produce a read enable signal to the synchronous FIFO that allows regular or continuous operation of the synchronous FIFO during decoding operations.

14. The apparatus of claim 2, wherein:
the data width converter is to provide the clock count value to the latency predictor for respective clock count values of a repeating cycle of clock count values.

15. The apparatus of claim 14, comprising:
a timestamp circuit to timestamp the error corrected data stream, the timestamp circuit to receive the latency value from the latency predictor and to adjust the timing at least partially based on the latency value.

16. The apparatus of claim 1, wherein:
the error correction output of the FEC decoder to produce the one or more error correction values for respective ones of the one or more FEC code words in the second output data stream for correction of respective ones of the one or more symbols, the one or more partial symbols, or both, in the first output data stream having the first bit width.

17. The apparatus of claim 1, wherein:
the FEC decoder is operative on k symbols in the second output data stream having the second output bit width, respective ones of the k symbols comprise a symbol width of s bits, and the second output bit width is an integer multiple of the symbol width of s bits, wherein k and s are positive integers.

18. The apparatus of claim 17, wherein:
the symbol width is ten (10) bits, and
the at least second output bit width is seventy (70) bits or eighty (80) bits.

19. The apparatus of claim 18, wherein:
the input bit width is seventy-two (72) bits, and
the first output bit width is sixty-five (65) bits.

20. A method comprising:
converting an input data stream having an input bit width to a first output data stream having a first output bit width and to a second output data stream having a second output bit width, the input data stream and the first output data stream in a receive data path;
performing a forward error correction (FEC) decoding process on one or more FEC code words of the second output data stream having the second output bit width to produce one or more error correction values, at least a part of the FEC decoding process performed in parallel with the receive data path;
correcting one or more symbols, one or more partial symbols, or both, in the first output data stream having the first output bit width at least partially based on the one or more error correction values; and
signaling a latency predictor with a clock count value for selection of a latency value, the latency predictor comprising a look up table of latency values respectively associated with clock count values, the latency value for adjustment of timing used for timestamping data stream communications in the receive data path.

21. The method of claim 20, wherein:
signaling the latency predictor with the clock count value for selection of the latency value is performed for respective clock count values of a repeating cycle of clock count values.

22. The method of claim 20, comprising:
writing into a synchronous first-in-first-out (FIFO) the first output data stream having the first bit width; and
reading out from the synchronous FIFO the first output data stream having the first bit width.

23. The method of claim 20, wherein correcting the one or more symbols, the one or more partial symbols, or both, comprises correcting the one or more partial symbols.

24. The method of claim 23, wherein:
the at least part of the FEC decoding process performed in parallel with the receive data path is performed on k symbols in the second output data stream having the second output bit width, wherein k is a positive integer, and respective ones of the k symbols comprise a symbol width of ten (10) bits, and
correcting the one or more partial symbols comprises correcting the one or more partial symbols having a partial symbol width of five (5) bits.

25. The method of claim 20, wherein the at least part of the FEC decoding process performed in parallel with the receive data path comprises:
generating one or more error magnitude values comprising the one or more error correction values.

26. The method of claim 25, wherein generating comprises:
selectively providing a selected number of the one or more error magnitude values comprising the one or more error correction values.

27. The method of claim 20, wherein the at least part of the FEC decoding process performed in parallel with the receive data path comprises:
calculating one or more syndromes at least partially based on the one or more FEC code words in the second output data stream having the second output bit width.

28. The method of claim 27, wherein respective ones of k symbols in the second output data stream comprise a symbol width of ten (10) bits, the method comprising:
calculating the one or more syndromes with respect to k symbols of the second output data stream, wherein k=7, and
calculating the one or more syndromes with respect to k symbols of the second output data stream, wherein k=8.

29. The method of claim 21, wherein:
signaling the latency predictor with the clock count value is from a data width converter used for converting the input data stream.

30. The method of claim 29, comprising:
adjusting the timing of a timestamping process for the timestamping of the data stream communications in the receive data path at least partially based on the latency value received from the latency predictor, the latency value responsive to the clock count value.

31. An apparatus comprising:
a data width converter in a receive data path, the data width converter including an input to receive an input data stream having an input bit width, a first output to produce a first output data stream having a first output bit width, and a second output to produce a second output data stream having a second output bit width;
a synchronous first-in-first-out (FIFO) in the receive data path, the synchronous FIFO having an input to which the first output data stream having the first bit width is written into the synchronous FIFO, the synchronous FIFO having an output to which the first output data stream having the first bit width is read out from the synchronous FIFO;
at least a portion of a forward error correction (FEC) decoder in parallel with the receive data path, the at least portion of the FEC decoder including an input to receive the second output data stream having the second output bit width, the at least portion of the FEC decoder including an error correction output to produce one or more error correction values at least partially based on one or more FEC code words in the second output data stream having the second output bit width; and
a symbol error corrector in the receive data path, the symbol error corrector having a first input operably coupled to the output of the synchronous FIFO, a second input operably coupled to the error correction output of the FEC decoder, and an output to produce an error-corrected data stream from the first output data stream having the first bit width at least partially based on the one or more error correction values that correct one or more symbols, one or more partial symbols, or both, in the first output data stream.

32. The apparatus of claim 31, wherein:
the symbol error corrector in the receive data path is to:
correct the one or more symbols, the one or more partial symbols, or both, including respective symbols of ten (10) bits, and
correct the one or more symbols, the one or more partial symbols, or both, including respective partial symbols of five (5) bits.

33. The apparatus of claim 31, wherein the FEC decoder comprises:
a syndrome calculator, the syndrome calculator including an input to receive the second output data stream having the second output bit width, the syndrome calculator operative on a variable number of k symbols, the syndrome calculator to:
calculate one or more syndromes with respect to k symbols of the second output data stream, where k=7, and
calculate one or more syndromes with respect to k symbols of the second output data stream, where k=8.

34. An apparatus comprising:
a data width converter, the data width converter including an input to receive an input data stream having an input bit width, a first output to produce a first output data stream having a first output bit width, and a second output to produce a second output data stream having a second output bit width;
a synchronous first-in-first-out (FIFO), the synchronous FIFO having an input to which the first output data stream having the first bit width is written into the synchronous FIFO, the synchronous FIFO having an output to which the first output data stream having the first bit width is read out from the synchronous FIFO; and
a forward error correction (FEC) decoder, the FEC decoder including an input to receive the second output data stream having the second output bit width, the FEC decoder including an error correction output to produce one or more error correction values at least partially based on one or more FEC code words in the second output data stream, the one or more error correction values for correction of one or more symbols, one or more partial symbols, or both, in the first output data stream having the first output bit width read out from the synchronous FIFO.

35. The apparatus of claim 34, wherein the FEC decoder comprises:
a symbol error corrector, the symbol error corrector having a first input operably coupled to the output of the synchronous FIFO, a second input operably coupled to the error correction output of the FEC decoder, and an output to produce an error-corrected data stream from the first output data stream having the first bit width at least partially based on the one or more error correction values that correct the one or more symbols, the one or more partial symbols, or both, the symbol error corrector to:
- correct the one or more symbols, the one or more partial symbols, or both, including respective symbols of ten (10) bits, and
- correct the one or more symbols, the one or more partial symbols, or both, including respective partial symbols of five (5) bits.

36. A method comprising:
converting an input data stream having an input bit width to a first output data stream having a first output bit width and to a second output data stream having a second output bit width;
writing into a synchronous first-in-first-out (FIFO) the first output data stream having the first output bit width;
performing a forward error correction (FEC) decoding process on one or more FEC code words of the second output data stream having the second output bit width to produce one or more error correction values; and
correcting one or more symbols, one or more partial symbols, or both, in the first output data stream having the first output bit width, read out from the synchronous FIFO, at least partially based on the one or more error correction values.

37. The method of claim 36, wherein correcting the one or more symbols, the one or more partial symbols, or both, includes correcting respective symbols of ten (10) bits and correcting respective partial symbols of five (5) bits.

38. The method of claim 36, wherein performing the FEC decoding process comprises:
- calculating one or more syndromes with respect to k symbols of the second output data stream, wherein k=7, and
- calculating one or more syndromes with respect to k symbols of the second output data stream, wherein k=8.

* * * * *

UNITED STATES PATENT AND TRADEMARK OFFICE
CERTIFICATE OF CORRECTION

PATENT NO. : 12,395,188 B2
APPLICATION NO. : 18/481359
DATED : August 19, 2025
INVENTOR(S) : Sailaja Akkem It is certified that error appears in the above-identified patent and that said Letters Patent is hereby corrected as shown below:

In the Specification

Column 18, Line 59, change "the 326*t* h symbol)." to --at the $326^{th}$ symbol).--

Signed and Sealed this
Thirtieth Day of September, 2025

John A. Squires
*Director of the United States Patent and Trademark Office*